United States Patent
Yabu et al.

(10) Patent No.: US 8,497,489 B2
(45) Date of Patent: Jul. 30, 2013

(54) CHAMBER APPARATUS AND METHOD OF MAINTAINING TARGET SUPPLY UNIT

(75) Inventors: Takayuki Yabu, Hiratsuka (JP); Kouji Kakizaki, Hiratsuka (JP); Yukio Watanabe, Hiratsuka (JP); Osamu Wakabayashi, Hiratsuka (JP)

(73) Assignee: Gigaphoton Inc., Tochigi (JP)

( * ) Notice: Subject to any disclaimer, the term of this patent is extended or adjusted under 35 U.S.C. 154(b) by 197 days.

(21) Appl. No.: 13/051,649

(22) Filed: Mar. 18, 2011

(65) Prior Publication Data

US 2011/0310365 A1 Dec. 22, 2011

(30) Foreign Application Priority Data

Mar. 18, 2010 (JP) .................................. 2010-062380
Jan. 25, 2011 (JP) .................................. 2011-013014

(51) Int. Cl.
*G01K 5/00* (2006.01)
(52) U.S. Cl.
USPC .................. 250/504 R; 250/492.1; 250/493.1
(58) Field of Classification Search
USPC ...................... 250/492.1, 493.1, 503.1, 504 R
See application file for complete search history.

(56) References Cited

U.S. PATENT DOCUMENTS

| | | | |
|---|---|---|---|
| 7,449,703 B2 | 11/2008 | Bykanov | |
| 7,628,865 B2 * | 12/2009 | Singh | ................................ 134/1 |
| 2005/0178979 A1 * | 8/2005 | Masaki et al. | ............. 250/492.1 |
| 2006/0192154 A1 | 8/2006 | Algots et al. | |
| 2006/0192155 A1 | 8/2006 | Algots et al. | |
| 2010/0097593 A1 * | 4/2010 | Murakami | ...................... 355/67 |

* cited by examiner

*Primary Examiner* — Nicole Ippolito
(74) *Attorney, Agent, or Firm* — McDermott Will & Emery LLP

(57) ABSTRACT

A chamber apparatus used with a laser apparatus may include: a chamber provided with at least one inlet for introducing thereinto a laser beam outputted from the laser apparatus; a target supply unit provided to the chamber for supplying a target material to a predetermined region in the chamber; a recovery control unit for instructing the target supply unit to execute recovery operation if a predetermined condition is met; a recovery unit for executing the recovery operation in response to the instruction from the recovery control unit; and a position measuring unit for measuring a position of the target material supplied from the target supply unit into the chamber.

4 Claims, 30 Drawing Sheets

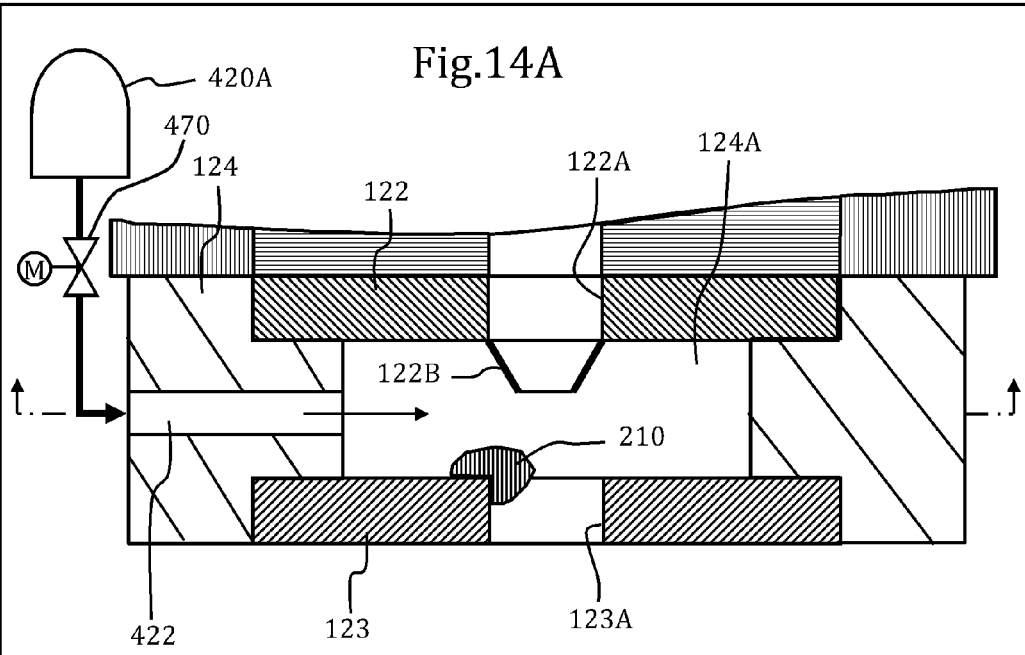
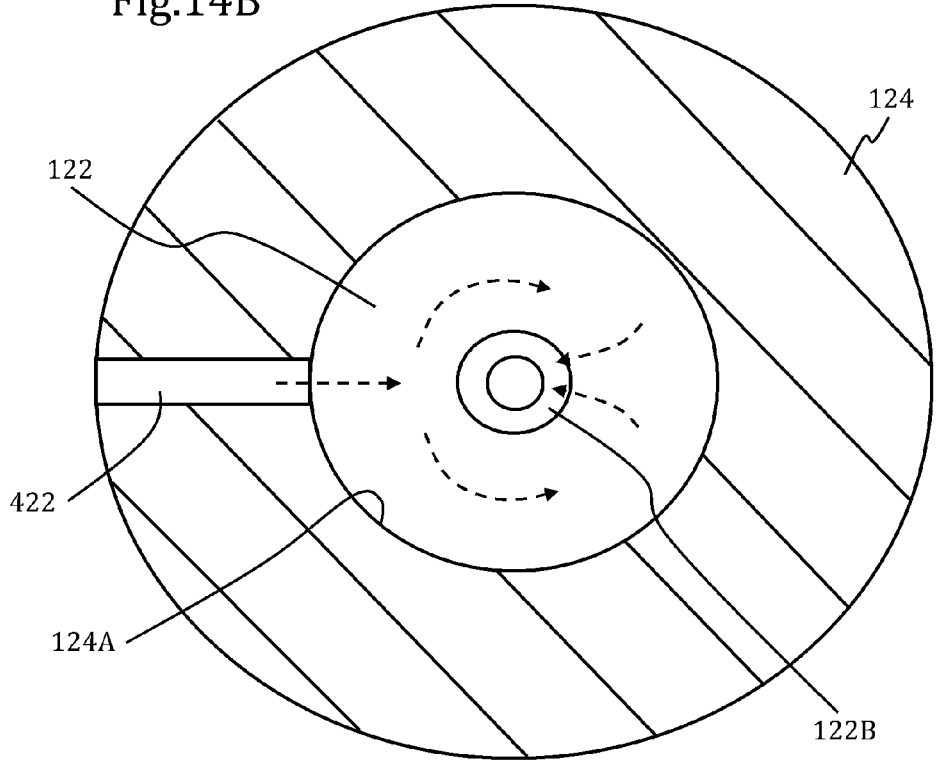

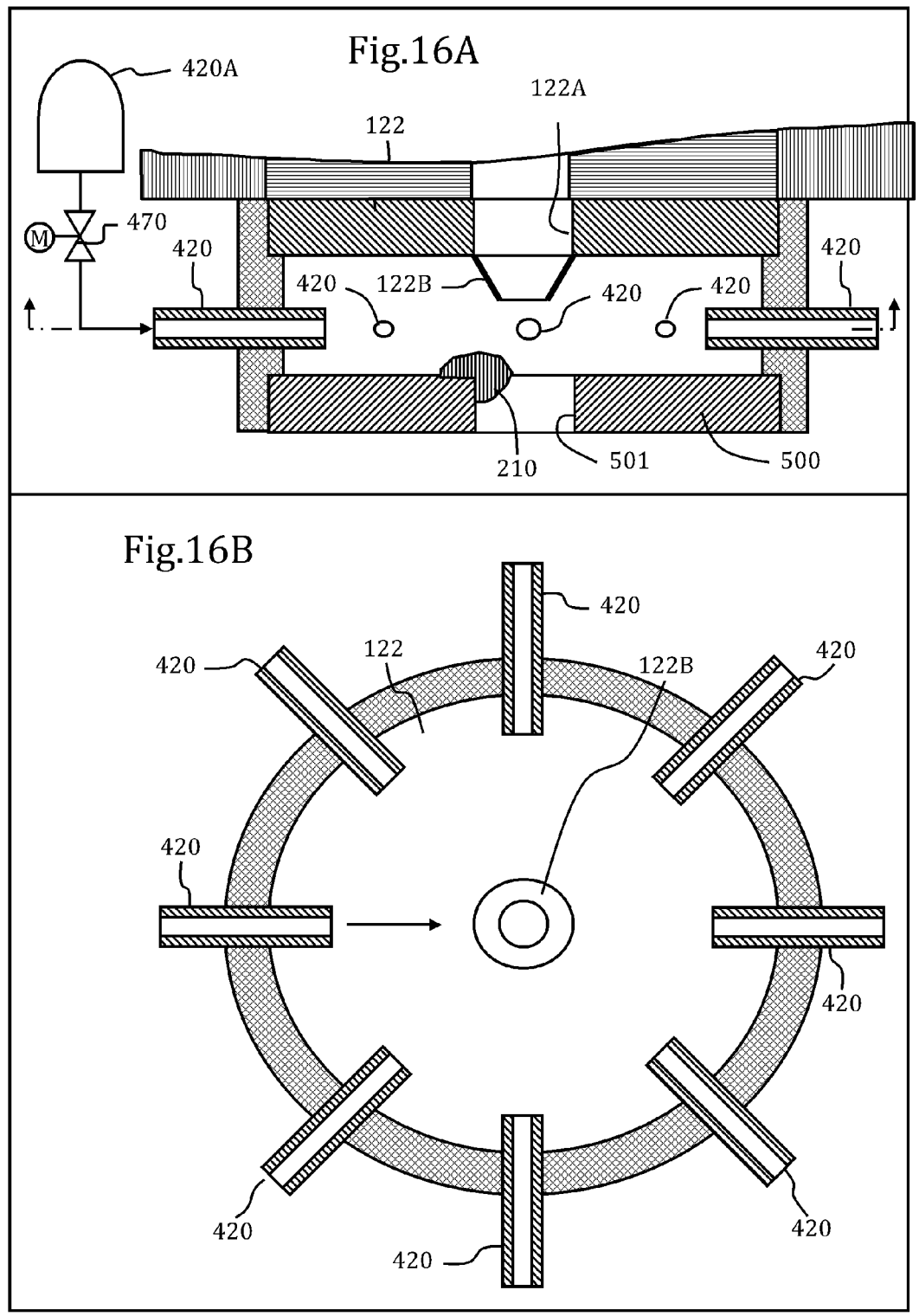

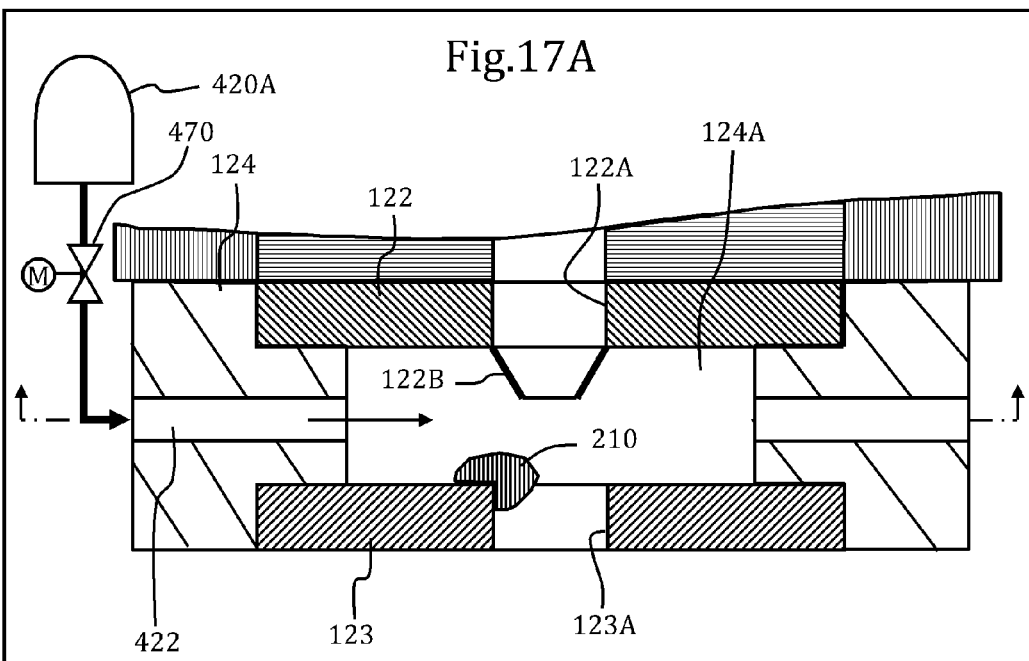
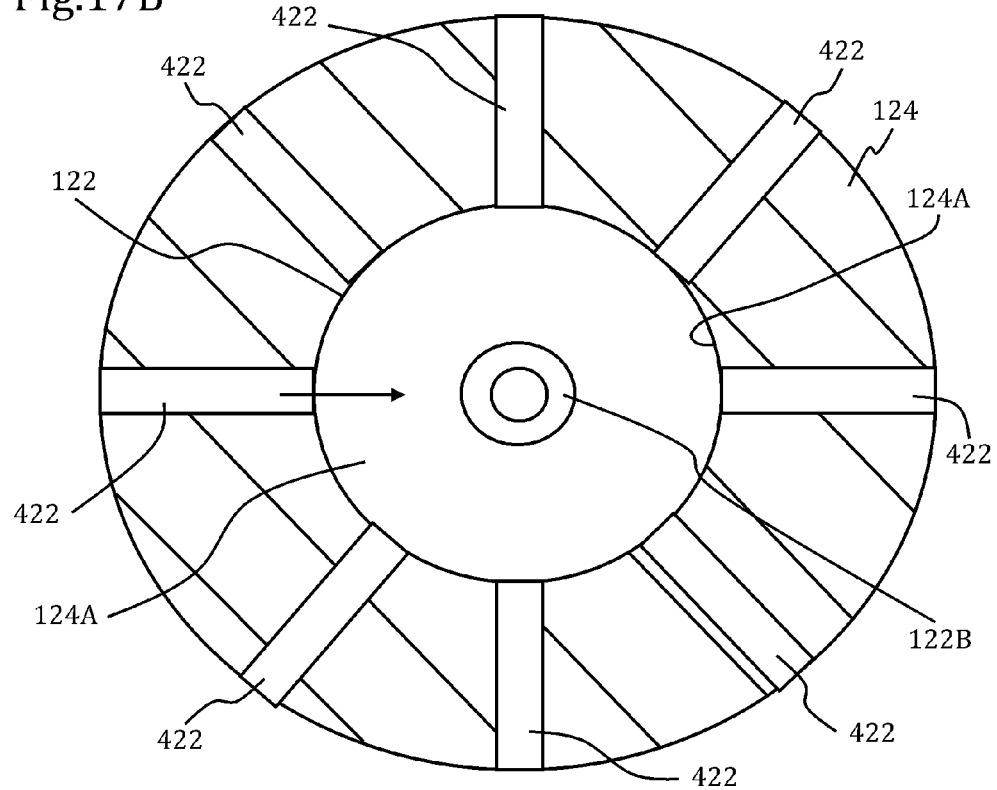

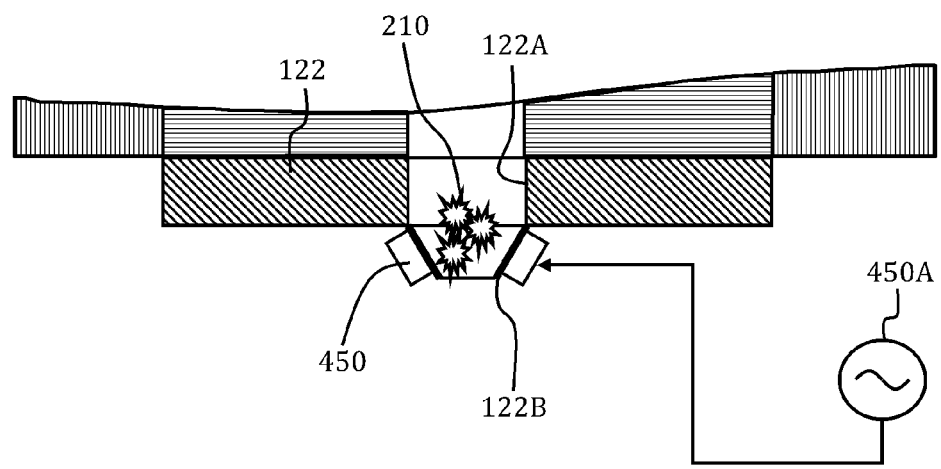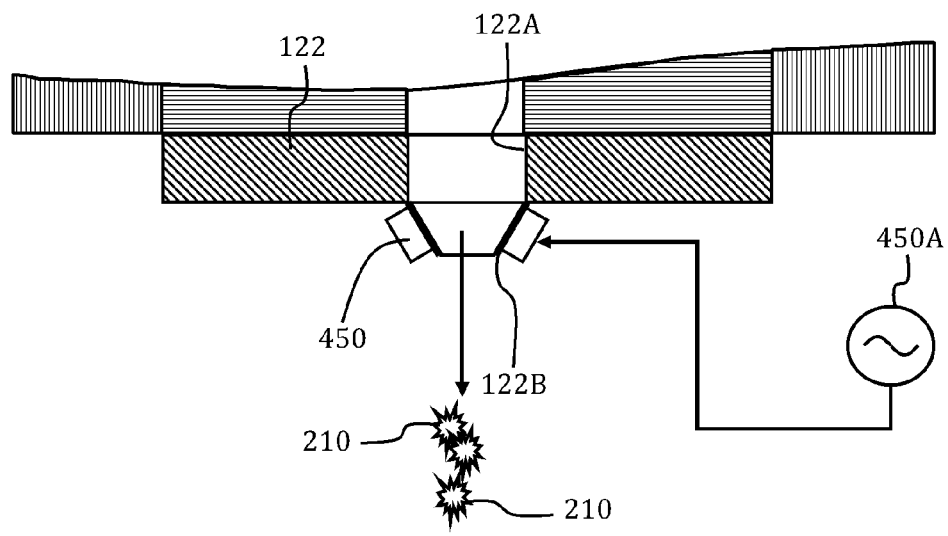

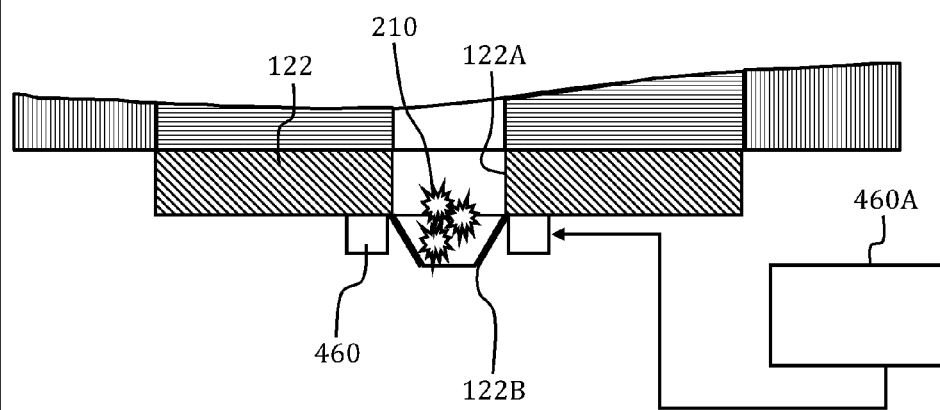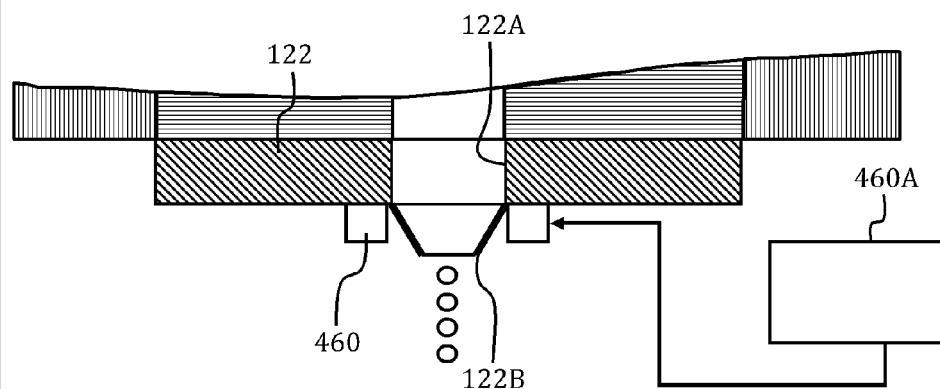

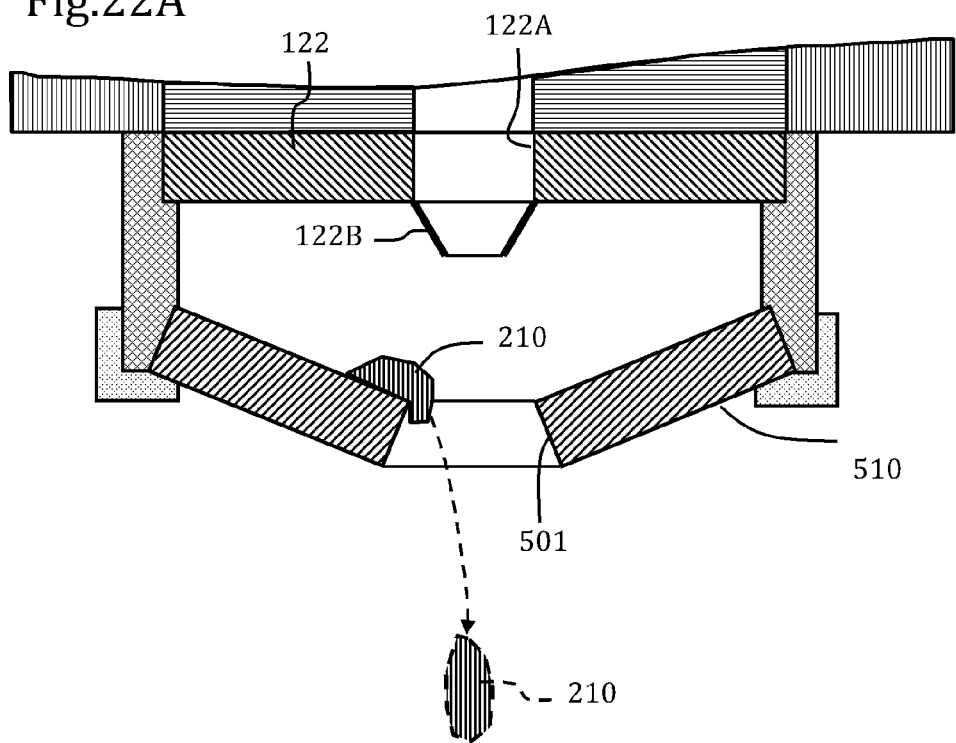
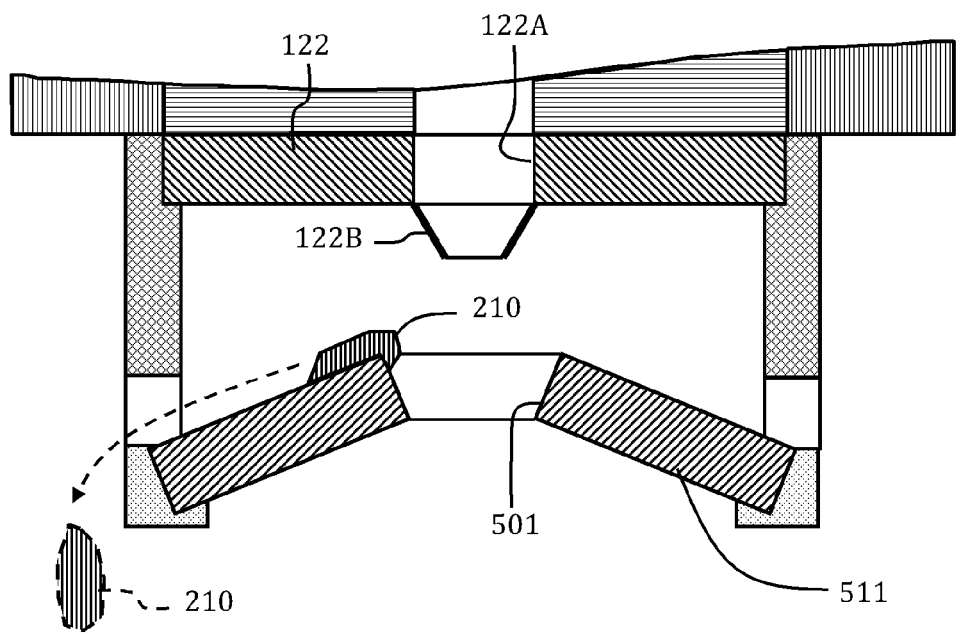

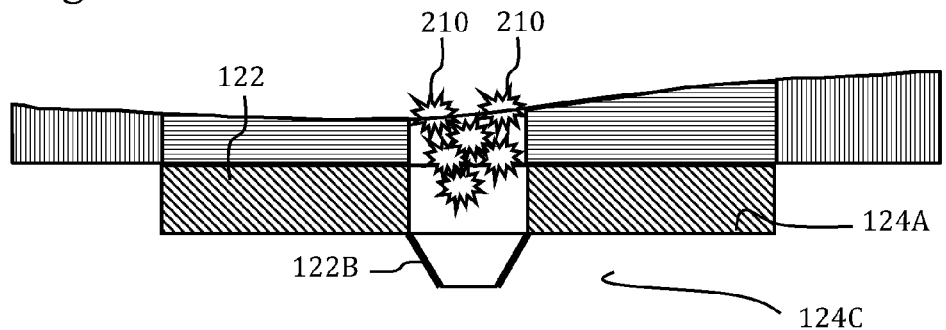
Fig.23A
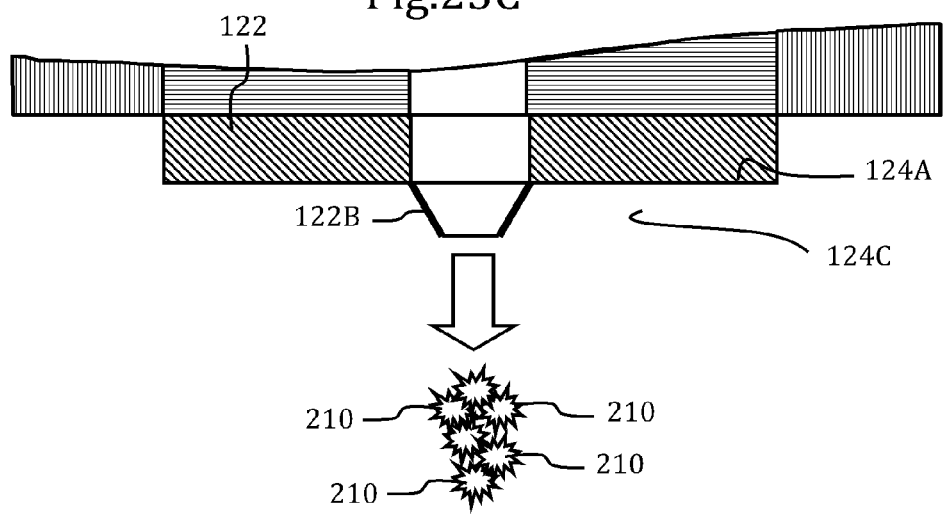
Fig.23B
| Method for Discharging Foreign Matter in Nozzle | Pressurize Target Material with Gas |
| --- | --- |
| | Decrease Volume of Target Material Channel |
| | Pull out with Force of Electric Field |
Fig.23C

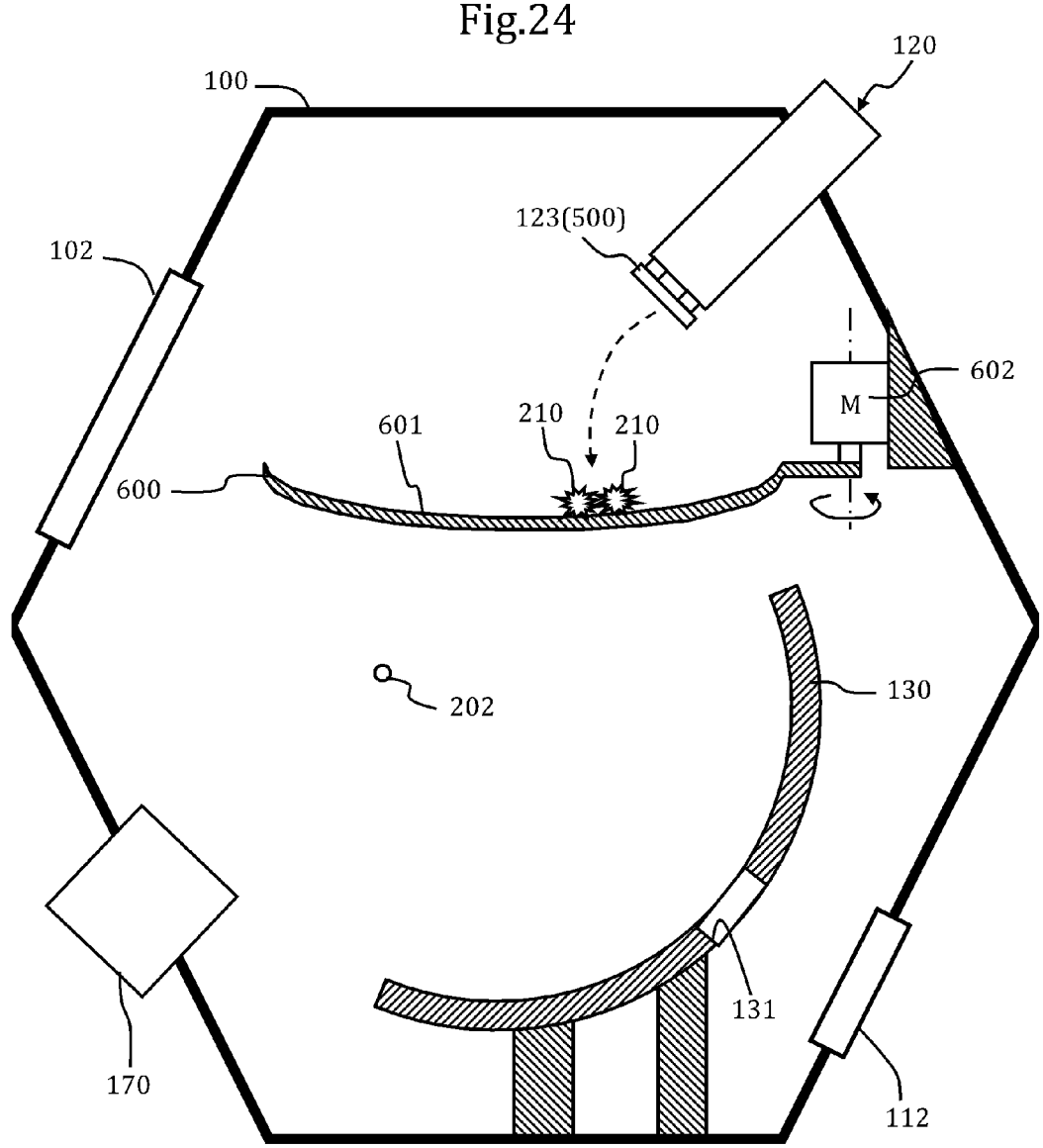

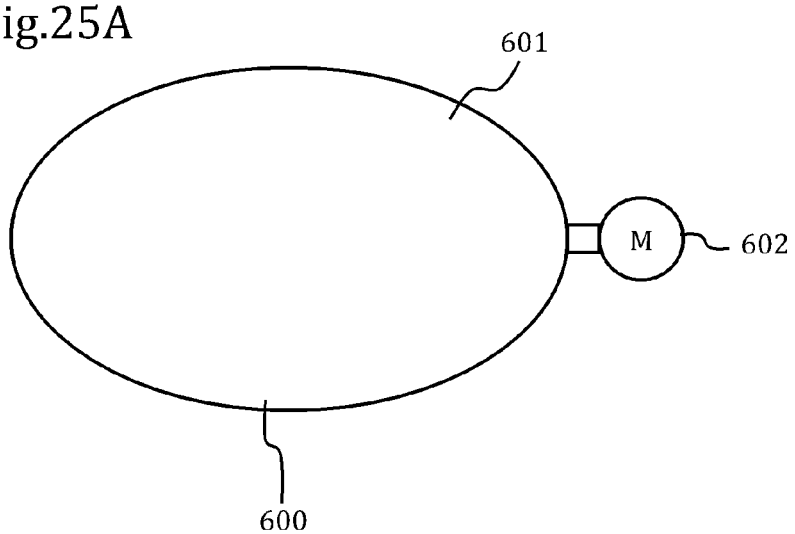
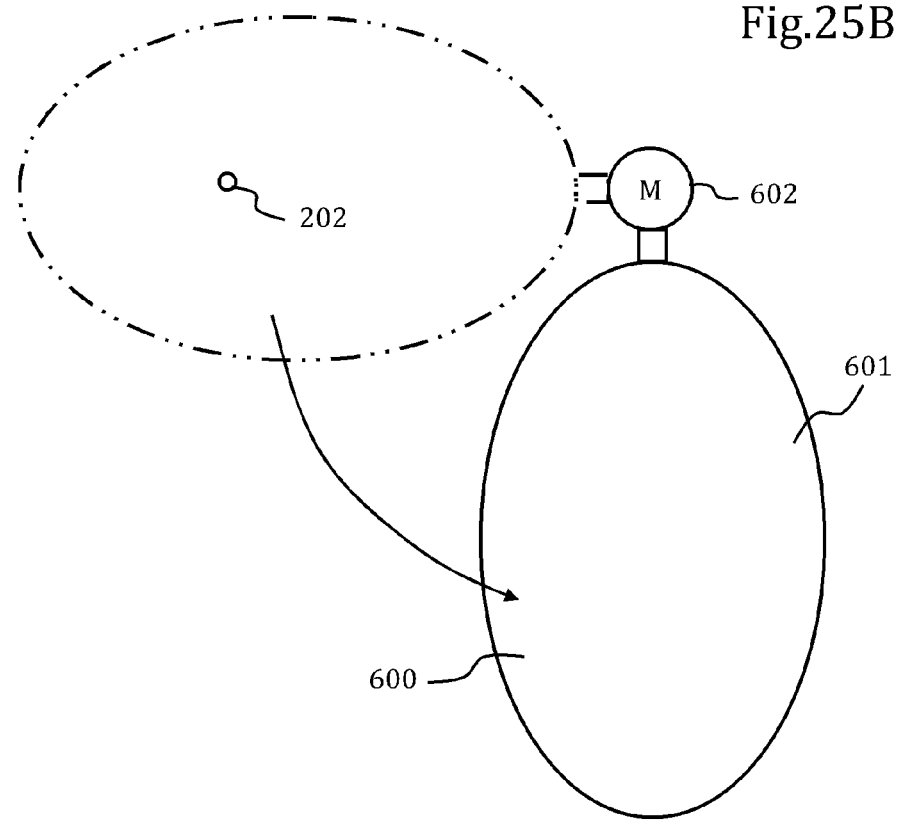

CHAMBER APPARATUS AND METHOD OF MAINTAINING TARGET SUPPLY UNIT

CROSS-REFERENCE TO RELATED APPLICATIONS

The present application claims priority from Japanese Patent Application No. 2010-062380 filed Mar. 18, 2010, and Japanese Patent Application No. 2011-013014 filed Jan. 25, 2011, the disclosure of each of which is incorporated herein by reference in its entirety.

BACKGROUND

1. Technical Field

The present disclosure relates to a chamber apparatus and to a method for maintaining a target supply unit.

2. Related Art

With recent increase in integration of semiconductor process, transfer patterns for use in photolithography of the semiconductor process have rapidly become finer. In the next generation, microfabrication at 70 to 45 nm, and further, microfabrication at 32 nm or less is to be demanded. Accordingly, for example, to meet the demand for microfabrication at 32 nm or less, an exposure apparatus is expected to be developed, where EUV light at a wavelength of approximately 13 nm is combined with a reduction projection reflective optical system.

There are mainly three types of known EUV light generation apparatuses, namely, a laser produced plasma (LPP) type apparatus using plasma produced as a target material is irradiated with a laser beam, a discharge produced plasma (DPP) type apparatus using plasma produced by a discharge, and a synchrotron radiation (SR) type apparatus using orbital radiation.

SUMMARY

A chamber apparatus according to one aspect of this disclosure may be a chamber apparatus used with a laser apparatus, and the chamber apparatus may include: a chamber provided with at least one inlet for introducing thereinto a laser beam outputted from the laser apparatus; a target supply unit provided to the chamber for supplying a target material to a predetermined region in the chamber; a recovery control unit for instructing the target supply unit to execute recovery operation if a predetermined condition is met; a recovery unit for executing the recovery operation in response to the instruction from the recovery control unit; and a position measuring unit for measuring a position of the target material supplied from the target supply unit into the chamber.

A method for maintaining a target supply unit according to another aspect of this disclosure may be a method for maintaining a target supply unit in a chamber apparatus including a chamber, the target supply unit, a recovery control unit, a recovery unit, and a position measuring unit, and the method may include: acquiring determination information indicative of whether or not recovery operation is to be executed for the target supply unit; determining whether or not it is timing at which the recovery operation can be executed if it is determined that the recovery operation is to be executed; instructing the recovery unit by the recovery control unit to execute the recovery operation if it is determined that it is the timing at which the recovery operation can be executed; and executing predetermined recovery operation by the recovery unit in response to the instruction by the recovery control unit.

BRIEF DESCRIPTION OF THE DRAWINGS

FIG. 14A schematically illustrates the configuration for removing a foreign matter according to a ninth embodiment.

FIG. 14B is a sectional view of an insulator and a gas channel according to the ninth embodiment.

FIG. 16A schematically illustrates the configuration for removing a foreign matter according to an eleventh embodiment.

FIG. 16B is a sectional view of a nozzle unit and a gas pipe according to the eleventh embodiment.

FIG. 17A schematically illustrates the configuration for removing a foreign matter according to a twelfth embodiment.

FIG. 17B is a sectional view of an insulator and a gas channel according to the twelfth embodiment.

FIG. 20A schematically illustrates the configuration for removing a foreign matter according to a fifteenth embodiment.

FIG. 20B schematically illustrates the configuration for removing a foreign matter according to the fifteenth embodiment.

FIG. 21A schematically illustrates the configuration for removing a foreign matter according to a sixteenth embodiment.

FIG. 21B schematically illustrates the configuration for removing a foreign matter according to the sixteenth embodiment.

FIG. 22A schematically illustrates the configuration for removing a foreign matter according to a seventeenth embodiment.

FIG. 22B schematically illustrates the configuration for removing a foreign matter according to the seventeenth embodiment.

FIG. 23A schematically illustrates the configuration for removing a foreign matter according to an eighteenth embodiment.

FIG. 23B schematically illustrates the configuration for removing a foreign matter according to the eighteenth embodiment.

FIG. 23C schematically illustrates the configuration for removing a foreign matter according to the eighteenth embodiment.

FIG. 24 is a descriptive view schematically illustrating the configuration for protecting a collector mirror from a foreign matter.

FIG. 25A is a descriptive view schematically illustrating the configuration for switching positions of a protective cover.

FIG. 25B is a descriptive view schematically illustrating the configuration for switching the positions of the protective cover.

DESCRIPTION OF PREFERRED EMBODIMENTS

Figure 1:
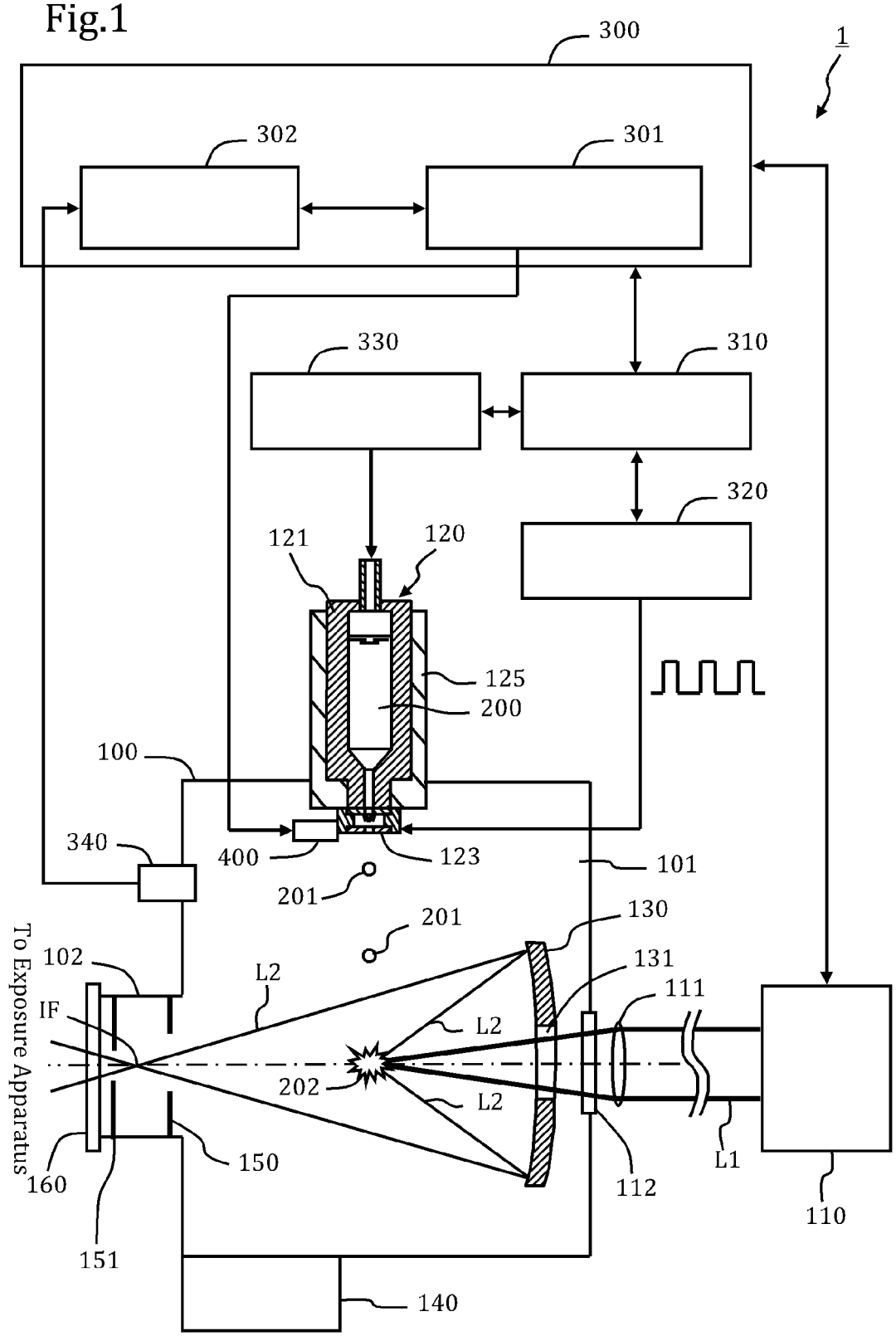
FIG. 1 schematically illustrates the general configuration of an EUV light generation apparatus according to a first embodiment of this disclosure.

Hereinafter, embodiments of this disclosure will be described in detail with reference to the drawings. The embodiments described below are examples of this disclosure, and do not limit the contents of this disclosure. Also, configurations and operations described according to the respective embodiments may not all be essential configurations and operations for this disclosure. It should be noted that like elements are referenced by like reference numerals, and duplicate description thereof will be omitted.

First Embodiment

A first embodiment will be described with reference to FIGS. 1 to 5. FIG. 1 schematically illustrates the general configuration of an EUV light generation apparatus 1. The EUV light generation apparatus 1 may include, for example, a vacuum chamber 100, a driver laser device 110, a target supply unit 120, an EUV collector mirror 130, a vacuum pump 140, partition walls 150 and 151 having apertures, a gate valve 160, an EUV light generation controller 300, a droplet controller 310, a pulse control unit 320, and a pressure control unit 330.

Each of the above-described constituent elements (1, 100, 110, 120, 130, 140, 150, 151, 160, 300, 310, 320, and 330) may be provided at least singly. However, without being limited thereto, each constituent element may be provided in plurality.

The vacuum chamber 100 may include a first chamber 101 and a second chamber 102. The first chamber 101 is a main chamber in which generation of plasma is performed. The second chamber 102 is a connection chamber through which EUV light emitted from the plasma is supplied to an exposure apparatus (not illustrated).

The vacuum pump 140 may be connected to the first chamber 101. With this, the interior of the chamber 100 may be maintained in a low-pressure state. Further, a configuration may be such that another vacuum pump is provided for the second chamber 102. In that case, the pressure in the first chamber 101 may be kept lower than the pressure in the second chamber 102, whereby debris can be prevented from flowing into the exposure apparatus.

The target supply unit 120 may function as a device for outputting a droplet 201 of, for example, a target material 200 such as tin (Sn), into the chamber 100. The droplet 201 may be a target to be irradiated with a laser beam. A main body 121 of the target supply unit 120 may store the target material 200 in a molten state, and predetermined pressure can be applied to the interior of the main body 121.

An electrode unit 123, which is an example of an "intermediate structure," may be provided at a tip side of a nozzle of the target supply unit 120. When predetermined pulse voltage is applied to the electrode unit 123, for example, an electric field may be generated between the target material 200 and the electrode unit 123. With this, the droplet 201 may be pulled out from the target supply unit 120, and the droplet 201 may be outputted into the chamber 100. The configuration of the target supply unit 120 will be described later in detail with reference to FIG. 2. Further, the output of the droplet is not limited to the method in which the electric field is used as described above. For example, the pressure may be applied to a molten target material, whereby the droplet 201 may be outputted.

The driver laser device 110 may output a pulsed laser beam L1 for turning the droplet 201 into plasma. The driver laser device 110 may be configured, for example, as a $CO_2$ (carbon dioxide gas) pulsed laser device. The driver laser device 110 may output the laser beam L1 having such specifications as a wavelength of 10.6 μm, an output of 20 kW, a pulse repetition rate in a range from 30 to 100 kHz, and a pulse width of 20 nsec. However, the specifications of the driver laser device 110 are not limited to the above-mentioned example. Further, the configuration may be such that a laser device aside from the $CO_2$ pulsed laser device is used.

The laser beam L1 outputted from the driver laser device 110 may enter the first chamber 101 via a focusing lens 111, a window 112, and so forth. The laser beam L1, having entered the first chamber 101, may pass through a through hole 131 provided in the EUV collector mirror 130, and may strike the droplet 201.

When the droplet 201 is irradiated with the laser beam L1, the droplet 201 may be turned into plasma in a plasma generation region 202. The plasma may emit light containing EUV light L2 at a wavelength of approximately 13.5 nm.

The EUV light L2 emitted from the plasma may be incident on a collector mirror 130 for collecting EUV, and reflected by the collector mirror 130. The collector mirror 130 may have the reflection surface thereof formed in a spheroid shape. The EUV light L2 reflected by the collector mirror 130 may be focused at IF (Intermediate Focus) in the second chamber 102. The EUV light L2 focused at IF may be guided to the exposure apparatus through the gate valve 160 in an open state.

In the first embodiment, the droplet 201 may be generated in an amount required for the generation of the EUV light in accordance with the frequency at which a laser beam is outputted from the driver laser device 110. Hence, the amount of debris generated may be small. However, in order to reduce an adverse effect caused by the debris, for example, two magnetic-field generation coils (not shown) may be provided such that the two magnetic-field generation coils face each other, with an optical path of the EUV light L2 therebetween, in the up-down direction of the sheet surface or in the direction perpendicular to the sheet surface of FIG. 1. Ionic debris may be trapped in a magnetic field generated with the magnetic-field generation coils.

The two partition walls 150 and 151 may be disposed in the vicinity of IF. The travel direction of the EUV light L2 reflected by the collector mirror 130 being the reference, the first partition wall 150 may be provided upstream of IF, and the second partition wall 151 may be provided downstream of IF. The partition walls 150 and 151 may, for example, have apertures of approximately several millimeters to 10 mm, respectively.

The first partition wall 150 may be provided near a position at which the first chamber 101 is connected to the second chamber 102. The second partition wall 151 may be provided near a position at which the second chamber 102 is connected to the exposure apparatus. Note that the configuration may be such that an SPF (Spectral Purity Filter) is provided at least one of the upstream side and the downstream side of IF, so that light at a wavelength of other than 13.5 nm is shielded.

Next, the configuration pertaining to the control in the EUV light generation apparatus 1 will be described. The EUV light generation controller 300 may control the operation of the EUV light generation apparatus 1. The EUV light generation controller 300 may give instructions to the droplet controller 310 and to the driver laser device 110. In response to the instructions, the droplet 201 may be outputted at predetermined timing. The outputted droplet 201 may be irradiated with the pulsed laser beam L1. Further, the EUV light generation controller 300 may control the operation of the vacuum pump 140, the gate valve 160, and so forth.

The EUV light generation controller 300 may include at least one recovery control unit 301 and at least one position measuring unit 302. The recovery control unit 301 may have a function of causing a recovery unit 400 to automatically perform maintenance on the target supply unit 120, when, for example, the above occurs to the target supply unit 120, thereby allowing the target supply unit 120 to recover to a normal state. The position measuring unit 302 may have a function of measuring the position of the droplet 201 based on a signal from at least one position detection sensor 340, and notifying the recovery control unit 301 of the result. A method of recovery control will be described later.

The recovery control unit 301 and the position measuring unit 302 may be configured as controllers separate from the EUV light generation controller 300, or may be configured as controllers provided in the droplet controller 310.

The position detection sensor 340 may be configured as a sensor that can detect the position of the droplet 201, and may, for example, be a camera, an optical sensor, an electromagnetic sensor, or the like. The configuration may be such that a plurality of the position detection sensors 340 of the same type or of different types is provided.

The droplet controller 310 may control the operation of the target supply unit 120. The pulse control unit 320 and the pressure control unit 330 may be connected to the droplet controller 310.

The pulse control unit 320 may function to apply predetermined pulse voltage to the electrode unit 123 provided at a leading end of the target supply unit 120. The pulse control unit 320 may include: for example, at least one high-voltage DC power supply device; at least one switching driver that outputs, as a pulse, DC high voltage inputted from the high-voltage DC power supply device; and at least one pulse generator that inputs the pulse frequency to the switching driver (not shown).

The pressure control unit 330 may function to apply predetermined pressure to the interior of the main body 121 of the target supply unit 120. The interior of the main body 121 may be controlled at predetermined pressure with inert gas (for example, argon gas) supplied via the pressure control unit 330.

Figure 2:
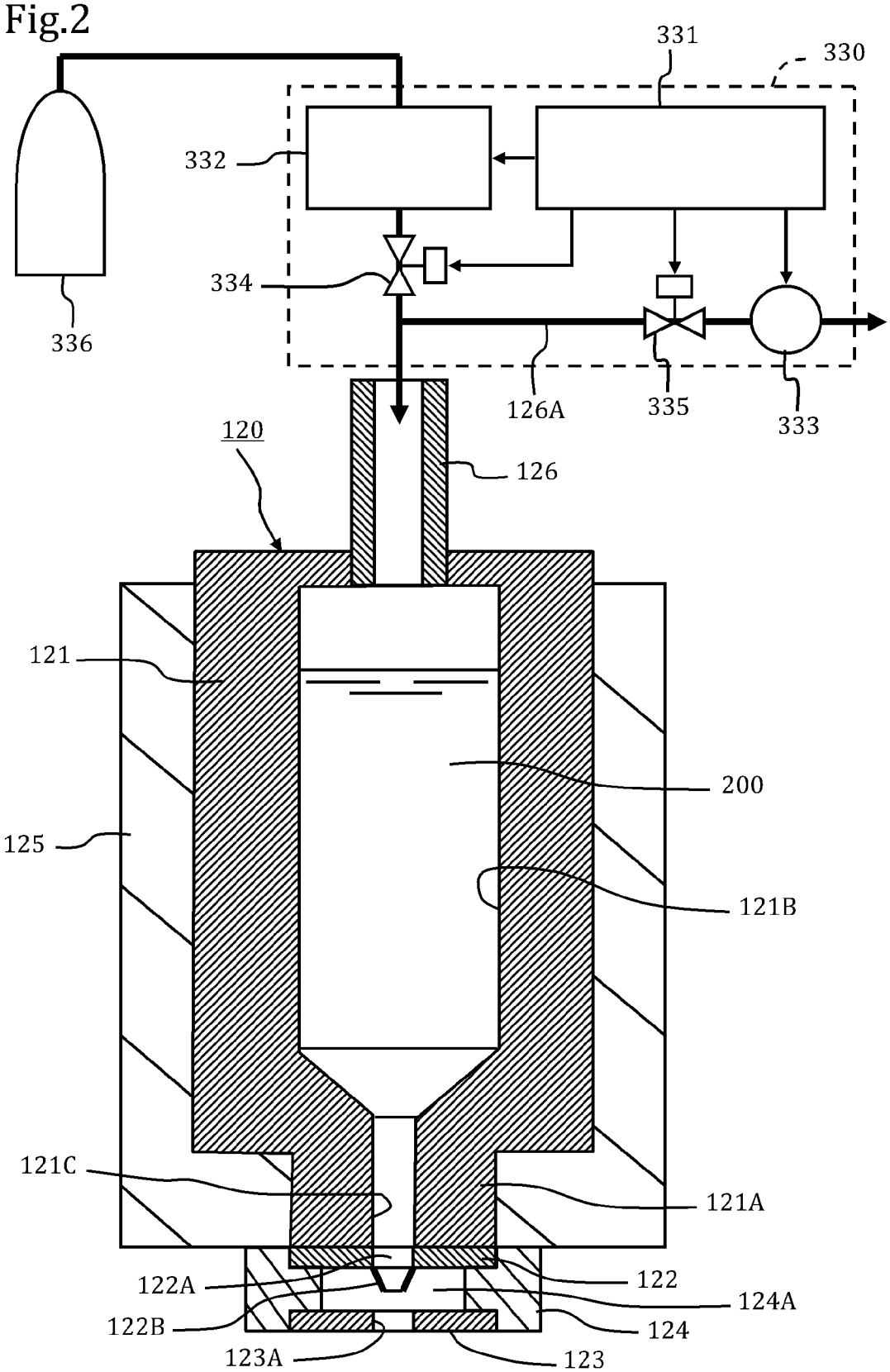
FIG. 2 schematically illustrates the configuration of a target supply unit and a pressure control unit according to the first embodiment.

FIG. 2 schematically illustrates the configuration of the target supply unit 120 and the pressure control unit 330. The configuration of the target supply unit 120 will be described first. The target supply unit 120 may include, for example, at least one main body 121, at least one nozzle unit 122, at least one electrode unit 123, at least one insulator 124, and at least one heating unit 125.

The main body 121 may store the target material 200. The main body 121 may be mounted to the chamber 100 such that the tip 121A thereof protrudes into the first chamber 101. A storage 121B for storing the target material 200 may be provided in the main body 121. An output channel 121C may be provided in the tip 121A.

The storage 121B may be connected to the pressure control unit 330 via a pipe 126 that is connected to a base end side of the main body 121. The output channel 121C may allow communication between the storage 121B and the nozzle unit 122. The inert gas supplied via the pressure control unit 330 may be supplied into the storage 121B of the main body 121 via the pipe 126.

The heating unit 125 may be provided on an outer surface of the main body 121. The heating unit 125 may be configured, for example, of an electric heater or the like. The heating unit 125 applies heat such that the temperature of the target material 200 (for example, tin) in the main body 121 is maintained approximately at 300° C. It is to be noted that the value of 300° C. is an example, and this disclosure is not limited to that value. That is, it is sufficient as long as the target material 200 is liquid at a given temperature.

The nozzle unit 122 may, for example, be formed in a disc shape. A circular output hole 122A may be formed at the center of the nozzle unit 122. The output hole 122A and the storage 121B of the main body 121 may preferably be in communication with each other via the output channel 121C. Further, a conical nozzle 122B facing downward may be provided, integrally with the nozzle unit 122, at the lower surface of the nozzle unit 122 such that the nozzle 122B protrudes toward the plasma generation region 202 in the first chamber 101. The nozzle 122B is formed so as to protrude into the first chamber 101, whereby the electric field may be enhanced at the tip of the nozzle 122B.

The material for the nozzle unit 122 will be described. First, the nozzle unit 122 comes into contact with the target material (for example, tin); thus, the nozzle unit 122 is preferably made of a material that is not susceptible to chemical or physical corrosion or erosion by tin. A property of not being susceptible to corrosion/erosion by tin is herein referred to as "corrosion/erosion resistance" to tin. Materials having the corrosion/erosion resistance to tin may include, for example, molybdenum (Mo), tungsten (W), tantalum (Ta), titanium (Ti), stainless steel, diamond, ceramics, and so forth. Also, materials other than ceramics may include silicon carbide, silicon nitride, aluminum oxide, zirconium oxide, diamond, silicon oxide, molybdenum oxide, tantalum oxide, tungsten oxide, and so forth. Ceramics may include ceramics containing, as a main component, silicon carbide, silicon nitride, aluminum oxide, zirconium oxide, diamond, silicon oxide, molybdenum oxide, tantalum oxide, tungsten oxide, and so forth. It is to be noted that, in the first embodiment, tin is cited as an example of the target material; however, the target material is not limited to tin. In the case where a material other than tin is used as the target material, the nozzle unit 122 may preferably be formed of a desirable material having the corrosion/erosion resistance to the given material. In the description to follow as well, tin will be described as the target material for a mere example; however, the target material is not limited to tin. In any case, in the case where a material other than tin is used as the target material, constituent elements described hereinafter to preferably have the corrosion/erosion resistance to tin may be configured of a desirable material having the corrosion/erosion resistance to the given material.

Second, from the viewpoint of enhancing the electric field at the tip of the nozzle unit 122, the nozzle unit 122 preferably has an electrical insulating property. Among the materials having the corrosion/erosion resistance to tin, diamond or ceramics is known as a material having an electrical insulating property. Hence, the nozzle unit 122 may preferably be configured of diamond or ceramics. However, without being limited thereto, a nozzle unit formed of a material aside from diamond or ceramics is included in the scope of this disclosure. For example, materials other than ceramics may include silicon carbide, silicon nitride, aluminum oxide, zirconium oxide, diamond, silicon oxide, molybdenum oxide, tantalum oxide, tungsten oxide, and so forth. Ceramics may include ceramics containing, as a main component, silicon carbide, silicon nitride, aluminum oxide, zirconium oxide, diamond, silicon oxide, molybdenum oxide, tantalum oxide, tungsten oxide, and so forth.

The main body 121 is at least required to have the corrosion/erosion resistance to tin. Of the entirety of the main body 121, part that comes into contact with tin may preferably have the corrosion/erosion resistance to tin.

The disc-shaped electrode unit 123 having a through hole provided at the center thereof may be provided below the nozzle unit 122 so as to be distanced from the nozzle unit 122 with the insulator 124 arranged therebetween. An output hole 123A of the electrode unit 123 may preferably be coaxial with the nozzle 122B. A predetermined gap may be formed between the output hole 123A and the tip of the nozzle 122B.

The material for the electrode unit 123 will be described. The electrode unit 123 may come into contact with tin; thus, the electrode unit 123 may preferably have the corrosion/erosion resistance to tin. The electrode unit 123 may further have resistance to sputtering. This is because tin particles, at high speed, from plasma may collide with a surface of the electrode unit 123. Further, the electrode unit 123 may preferably have electrical conductivity. The conditions above being considered, the electrode unit 123 may preferably be formed, for example, of molybdenum, tungsten, tantalum, titanium, stainless steel, and so forth.

Figure 6:
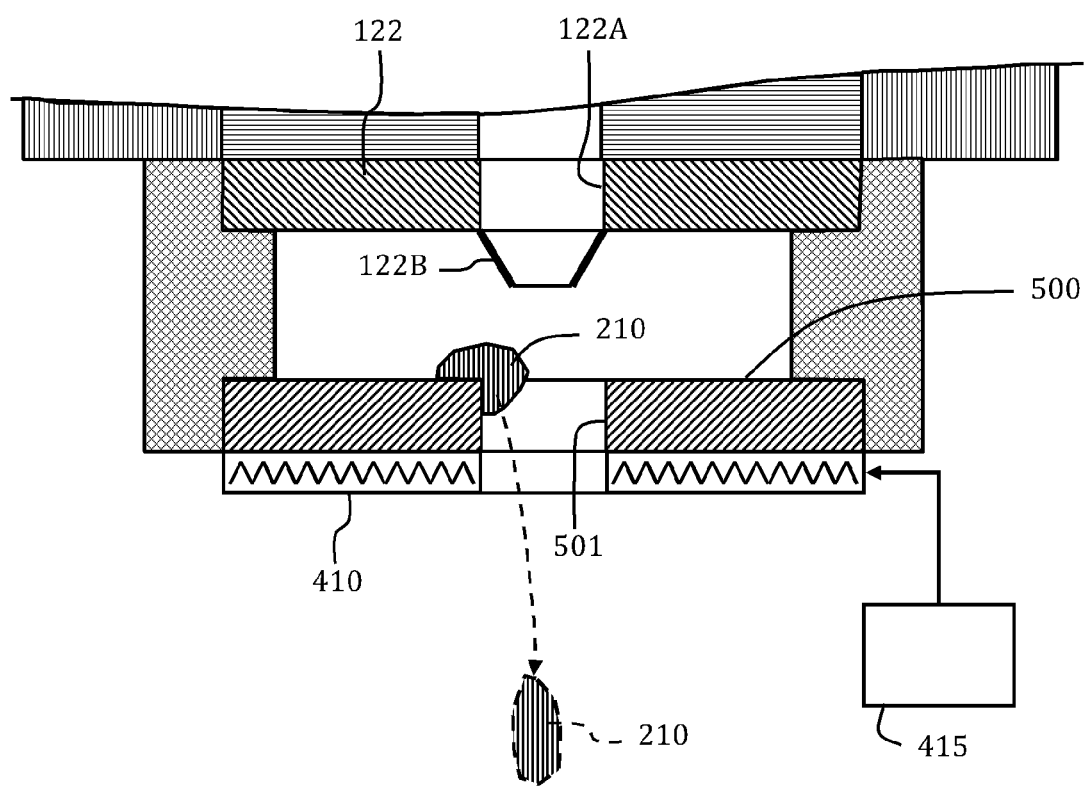
FIG. 6 schematically illustrates the configuration for removing a foreign matter according to a second embodiment.

Part of the droplet 201 may adhere to the electrode unit 123, and remain thereon as a foreign matter 210 (see FIG. 6). Hence, in embodiments described hereinafter, the electrode unit 123, which is an intermediate structure located between the nozzle unit 122 and the plasma generation region 202, may preferably be formed of a material having a low wettability to the target material 200. With this, the foreign matter 210 adhering to the electrode unit 123 can be allowed to drop and be removed. Accordingly, the electrode unit 123, for example, may preferably be formed of metal, such as molybdenum or tungsten, or ceramics such as alumina; or the electrode unit 123 may preferably be coated with such a material. Coating materials may include silicon carbide, silicon nitride, zirconium oxide, diamond, silicon oxide, molybdenum oxide, tantalum oxide, or tungsten oxide, or ceramics containing such a material as a main component.

The insulator 124 may be provided such that at least part thereof is arranged between the nozzle unit 122 and the electrode unit 123. A space 124A may be formed at an inner circumferential side of the insulator 124. The nozzle 122B may be provided so as to protrude into the space 124A. The nozzle 122B and the output hole 123A may preferably be coaxial.

The insulator 124 may preferably provide an insulating function and a heat transferring function, aside from a function of positioning the nozzle unit 122 and the electrode unit 123. The insulating function is a function of providing electrical insulation between the nozzle unit 122 and the electrode unit 123. The heat transferring function is a function of transmitting heat generated at the heating unit 125 to the electrode unit 123. With this, the temperatures of the nozzle unit 122 and of the electrode unit 123 may be made higher than the melting point of tin, whereby tin can be prevented from being fixed on the nozzle unit 122 and the electrode unit 123.

The material for the insulator 124 will be described. The insulating function and the heat transferring function being considered, the insulator 124 may preferably be constituted of a material with a high insulating property and a high thermal conductivity. Hence, the insulator 124, for example, may be constituted of a material, such as aluminum nitride (AlN), diamond, or the like. Alternatively, the insulator 124 may be constituted of ceramics containing, as a main component, silicon carbide, silicon nitride, aluminum oxide, zirconium oxide, diamond, silicon oxide, molybdenum oxide, tantalum oxide, tungsten oxide, and so forth.

The configuration of the pressure control unit 330 will be described. The pressure control unit 330 may include, for example, a pressure controller 331, a pressure adjusting valve 332, a discharge pump 333, a supply valve 334, and a discharge valve 335. The pressure control unit 330 may supply gas from a gas supply unit 336 into the main body 121 of the target supply unit 120 via the pressure adjusting valve 332, or the like. As the gas for applying pressure to the target material 200, argon gas is used in the first embodiment; however, inert gas aside from argon gas may be used.

The pressure adjusting valve 332 may adjust the pressure of gas supplied from the gas supply unit 336 and to be sent into the pipe 126 to predetermined pressure set by the pressure controller 331, and may send the gas into the pipe 126. The pipe 126 may constitute part of a gas channel from the pressure adjusting valve 332 to the main body 121. The gas, the pressure of which has been adjusted to the predetermined pressure, may be supplied into the main body 121 via the supply valve 334 provided midway in the piping leading to the pipe 126.

The discharge pump 333 is a pump for discharging the gas inside the main body 121. In a state in which the supply valve 334 is closed and the discharge valve 335 provided midway in a discharge channel 126A is open, the discharge pump 333 may be actuated. With this, the gas in the main body 121 may be discharged.

In a state in which constant pressure is applied to the target material 200, pulse voltage is applied to the electrode unit 123 at predetermined timing. The predetermined timing may preferably set to correspond to the frequency of the laser beam L1 outputted from the driver laser device 110. The pulse voltage may be a rectangular wave, a triangular wave, a sinusoidal wave, and so forth.

When the gas applies pressure to the target material 200 in the storage 121B, the target material 200 may slightly protrude from the nozzle 122B. However, in this state, the target material 200 is not outputted through the nozzle 122B. That is, meniscus protruding downward may be formed at the nozzle 122B.

In the state in which the gas applies pressure to the target material 200, when the pulse voltage is applied to the electrode unit 123, the target material 200 slightly protruding from the nozzle 122B may be separated from the tip of the nozzle with electrostatic attractive force. The target material 200 pulled out through the nozzle 122B may be outputted as the droplet 201 toward the plasma generation region 202. The droplet 201, which has been separated with the electrostatic attractive force, is electrically charged.

In the first embodiment, in the state in which the gas applies pressure to the target material 200 in the main body 121, the pulse voltage is applied to the electrode unit 123 provided so as to face the nozzle 122B. With this, in the first embodiment, the droplet 201 of a required size can be outputted through the nozzle 122B as required.

Figure 3:
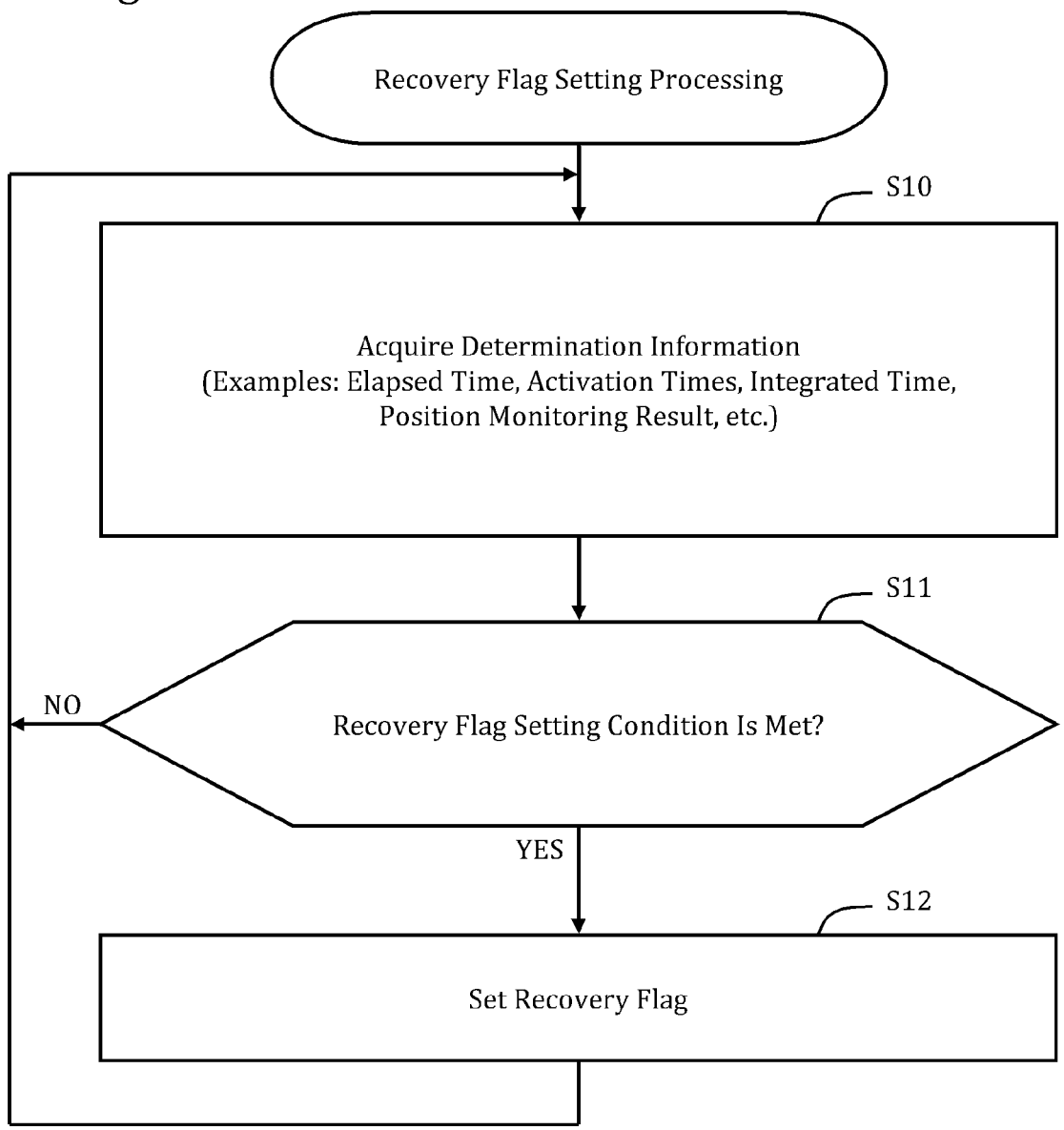
FIG. 3 is a flowchart of processing for setting a recovery flag.

FIG. 3 is a flowchart showing processing for setting a recovery flag. The recovery flag is information indicating that timing at which recovery operation should be executed has come. The recovery operation is, for example, operation of removing the foreign matter 210 from the target supply unit 120 so that the target material 200 can be outputted from the target supply unit 120 accurately toward the plasma generation region 202. This processing may be executed by the recovery control unit 301.

The recovery control unit 301 may acquire determination information (S10), and determine whether or not a condition for setting the recovery flag is met (S11). If the setting condition is met (S11: YES), the recovery control unit 301 may set the recovery flag (S12). If the setting condition is not met (S11: NO), the processing may return to S10.

The determination information is information used to determine whether or not the recovery flag should be set. As the determination information, for example, an elapsed time since the preceding recovery operation, the number of times the target supply unit 120 has been started, an integrated operating time of the target supply unit 120, positional accuracy of the droplet 201 in the plasma generation region 202, and so forth, may be cited as examples. Further, the number of times or the duration in which the target supply unit 120 has been heated, the number of times or the duration in which the droplet 201 has been outputted, and so forth, may be used as the determination information as well.

The recovery control unit 301 may determine whether or not the recovery flag should be set, based on at least one of the above-mentioned determination information. Specific examples in which the determination information is used will be described later in another embodiment.

Figure 4:
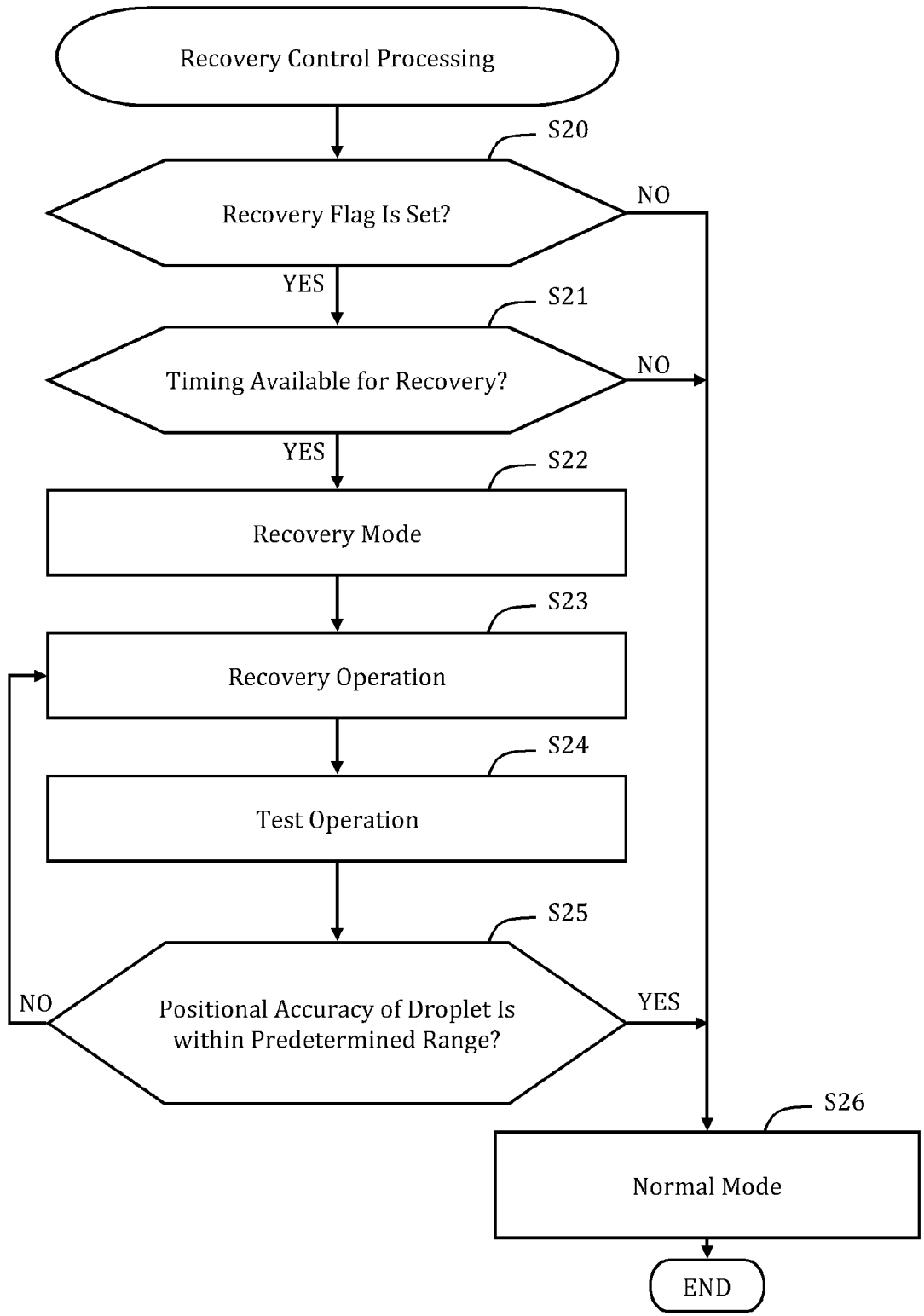
FIG. 4 is a flowchart showing recovery control processing.

FIG. 4 is a flowchart of recovery control processing. The recovery control unit 301 may determine whether or not the recovery flag is set (S20). If the recovery flag is not set (S20: NO), the recovery control unit 301 may shift to a normal mode (S26). The content of processing in the normal mode will be described later with reference to FIG. 5.

If the recovery flag is set (S20: YES), the recovery control unit 301 may determine whether or not it is the timing available for recovery (S21). If it is not the timing available for recovery (S21: NO), the recovery control unit 301 may shift to the normal mode (S26).

The timing available for recovery means timing at which the recovery operation can be executed. For example, even if the recovery flag is set, while exposure works are carried out in the exposure apparatus, the output of the EUV light cannot be stopped. The EUV light generation apparatus 1 needs to continue supplying the EUV light until a series of works is ended. Hence, in the first embodiment, for example, the processing may wait for timing at which the works in the exposure apparatus stop for a given period of time, and when the stop for the given period of time is ensured, the recovery operation may be executed. The recovery control unit 301 can determine the timing at which the works in the exposure apparatus are stopped for the given amount of time, by communicating with the exposure apparatus or by acquiring a signal from the exposure apparatus.

If the timing is the timing available for recovery (S21: YES), the recovery control unit 301 may shift to a recovery mode (S22). The recovery control unit 301 may give an instruction to the recovery unit 400 and hence may cause the recovery unit 400 to execute the recovery operation (S23).

After the recovery operation is executed, the recovery control unit 301 may cause the target supply unit 120 to execute test operation (S24). The test operation is so-called test shooting, and the target supply unit 120 may be made to output the droplet 201 by a predetermined number or for a predetermined period of time.

The recovery control unit 301 may determine whether or not the positional accuracy of the droplet 201, which has been outputted from the target supply unit 120, in the plasma generation region 202 is within a predetermined range, based on the measurement result by the position measuring unit 302 (S25).

For example, the recovery control unit 301 may determine whether or not the value of a positional variation ($3\sigma$) of the droplet 201 is equal to or smaller than $1/n$ (for example, n=2 to 3) of a diameter D of the droplet 201. The value of n is an example.

If the positional accuracy of the droplet 201 from the test shooting is within the predetermined range (S25: YES), the recovery control unit 310 may shift from the recovery mode to the normal mode (S26). In contrast, if the positional accuracy of the droplet 201 is not within the predetermined range (S25: NO), the recovery control unit 301 may cause the recovery unit 400 to execute the recovery operation again (S23).

Figure 5:
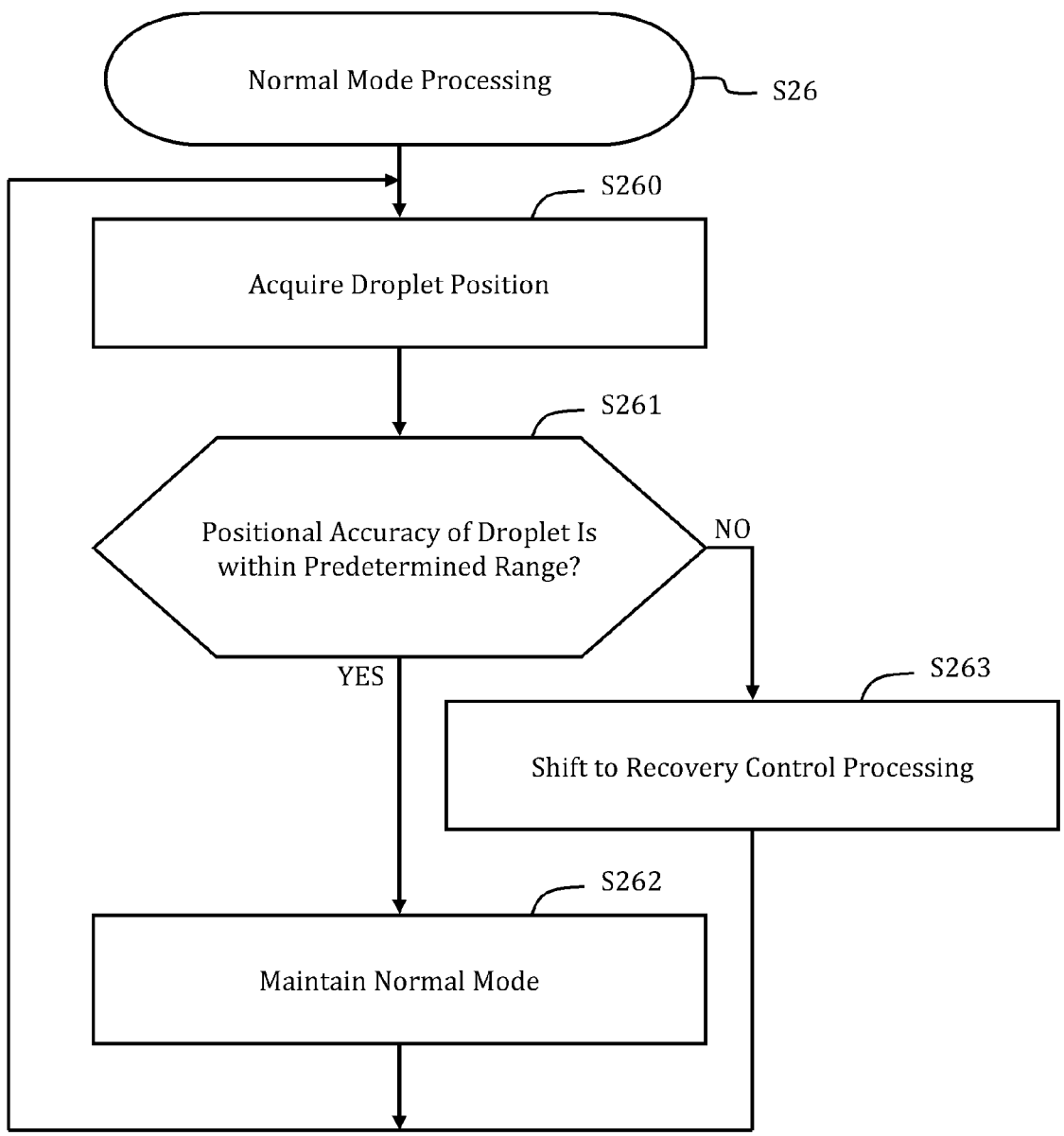
FIG. 5 is a flowchart showing processing in a normal mode.

FIG. 5 is a flowchart showing the detail of the normal mode processing (S26) shown in FIG. 4. The recovery control unit 301 may acquire the position of the droplet 201, based on the measurement result from the position measuring unit 302 (S260). It is to be noted that the normal mode is a state in which the droplet 201 is outputted at predetermined timing. When the droplet 201 outputted in the normal mode is irradiated with the pulsed laser beam L1, the generated EUV light L2 may be focused at IF and then guided to the exposure apparatus.

The recovery control unit 301 may determine whether or not the positional accuracy of the droplet 201 in the plasma generation region 202 is within the predetermined range (S261). If the positional accuracy of the droplet 201 is within the predetermined range (S261: YES), the recovery control unit 301 may remain in the normal mode (S262). This is because the droplet 201 outputted from the target supply unit 120 is considered to substantially accurately be arriving at the plasma generation region 202.

If the positional accuracy of the droplet 201 is not within the predetermined range (S261: NO), the recovery control unit 301 may shift from the normal mode to the recovery control processing (S263). When the recovery control unit 301 shifts to the recovery control processing, the recovery flag may be set. With this, the processing following S21 shown in FIG. 4 may be executed. As described above, the recovery operation for recovering the function of the target supply unit 120 may be executed at proper timing. Although not shown, if the function is not recovered even in the recovery mode, this may be notified through an alert or communication.

According to the first embodiment thus configured, since the recovery operation can be automatically executed, an operator does not constantly have to monitor the output state of the droplet, and maintenance efficiency may be increased.

Further, in the first embodiment, by temporarily executing the recovery operation without completely stopping the target supply unit 120, the target supply unit 120 can be recovered to the normal state. Accordingly, a time for maintaining the target supply unit 120 can be decreased, and an operating rate can be increased. Consequently, working efficiency of the exposure works can be increased.

Further, in the first embodiment, since recovery of the target supply unit 120 is carried out in consideration of the situation of a downstream process (exposure works), usability of the apparatus may be increased.

Second Embodiment

A second embodiment will be described with reference to FIG. 6. Embodiments described below may correspond to modifications of the first embodiment. Hence, the description is given mainly for points different from the first embodiment. In the second embodiment, a specific example of the recovery unit 400 will be described.

FIG. 6 is a descriptive view showing the tip of the target supply unit 120 in enlargement. The intermediate structure 500 may be provided so as to face the nozzle unit 122. A specific example of the intermediate structure 500 may be the electrode unit 123 shown in FIG. 2. The intermediate structure 500 is not limited to the electrode unit 123 to which pulsed voltage is applied for pulling out the target material 200 through the nozzle unit 122.

The intermediate structure 500 may be disposed between the nozzle unit 122 and the plasma generation region 202, and the foreign matter 210 derived from the droplet 201 or the like may adhere to the intermediate structure 500. Since the droplet 201 is electrically charged, the moving path and the speed thereof can be changed with an electric field or a magnetic field. Thus, by disposing the intermediate structure 500 at a proper position, the movement of the droplet 201 can be controlled. As the intermediate structure 500 aside from the electrode unit 123, for example, an electrostatic lens for correcting the moving path of the droplet 201, an acceleration electrode for increasing the speed of the droplet 201, and so forth, may be cited as examples. Also, without being limited thereto, the moving path of the droplet 201 may be corrected by using a permanent magnet, an electromagnetic coil, and so forth. The permanent magnet and the electromagnetic coil may be included in the intermediate structure 500.

A heater 410, which is an example of the recovery unit 400, may be provided on a lower surface of the intermediate structure 500. The heater 410, for example, may be formed annularly so as to cover the lower surface of the annular intermediate structure 500. The heater 410 may heat the foreign matter 210 adhering to the intermediate structure 500 so as to melt the foreign matter 210. The foreign matter 210 may be formed as the entirety or part of a single droplet 201 adheres to the intermediate structure 500. The heater 410 generates heat at a temperature exceeding the melting point of the target material 200 when a heater power supply 415 receives a signal outputted from the recovery control unit 301 and the electric power is supplied from the heater power supply 415 to the heater 410. Note that the intermediate structure 500 may be provided with a temperature sensor (not shown).

The foreign matter 210 molten with the heat from the heater 410 may fall from the intermediate structure 500 due to the gravity. The molten foreign matter 210 may drop, for example, through an opening 501 formed at the center of the intermediate structure 500.

In order to prevent the foreign matter 210 removed from the intermediate structure 500 from adhering to a component (for example, the collector mirror 130) arranged below the target supply unit 120, a configuration for trapping the removed foreign matter 210 or a configuration for protecting the collector mirror 130 from the foreign matter 210 may be provided in embodiments described later.

The second embodiment thus configured yields an advantage similar to that of the first embodiment. In the second embodiment, the foreign matter 210 adhering to the intermediate structure 500 may be molten and removed with the heat from the heater 410. Accordingly, the moving path of the droplet 201 can be prevented from being deviated due to the foreign matter 210 adhering to the intermediate structure 500, and the positional accuracy of the droplet 201 can be increased.

Third Embodiment

A third embodiment will be described with reference to FIG. 7. In the third embodiment, a heater 411, which is an example of the recovery unit 400, may be provided on an outer peripheral surface of the intermediate structure 500. The heater 411 is formed in a short cylindrical shape so as to cover the outer peripheral surface of the annular intermediate structure 500.

Figure 7:
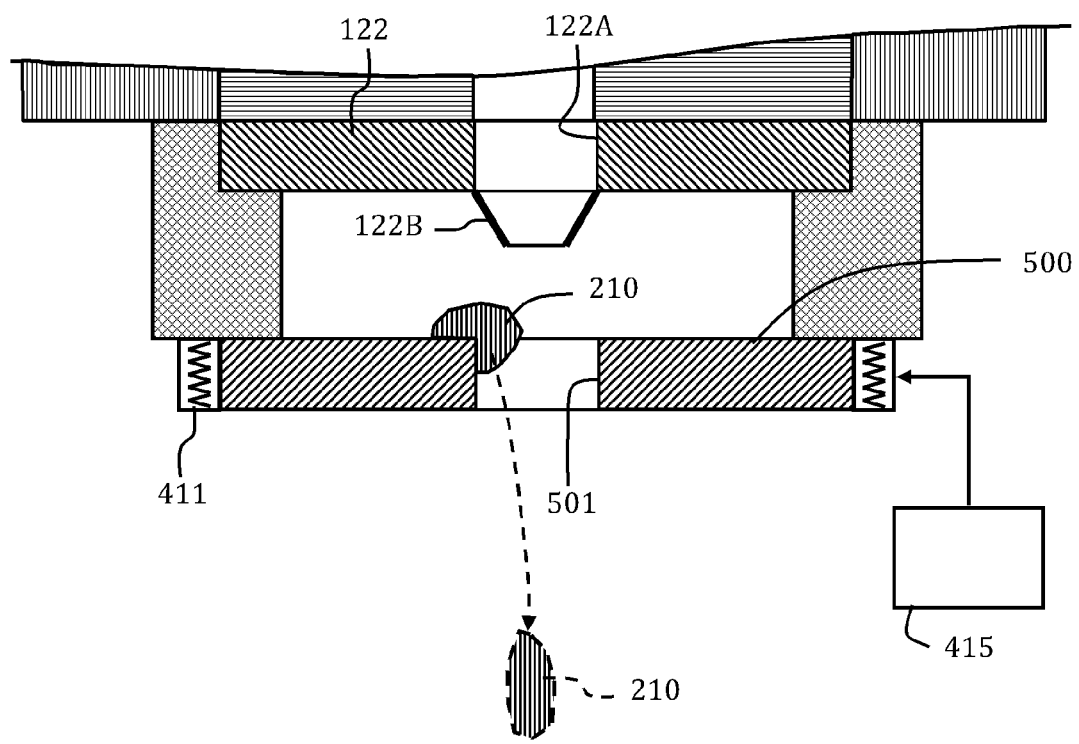
FIG. 7 schematically illustrates the configuration for removing a foreign matter according to a third embodiment.

FIG. 7 is a descriptive view showing the tip of the target supply unit 120 in enlargement. As in the second embodiment, the intermediate structure 500 being heated with the heater 411, the foreign matter 210 adhering to the surface of the intermediate structure 500 may be made to melt and drop to be removed. The third embodiment thus configured may yield an advantage similar to that of the second embodiment.

Fourth Embodiment

Figure 8:
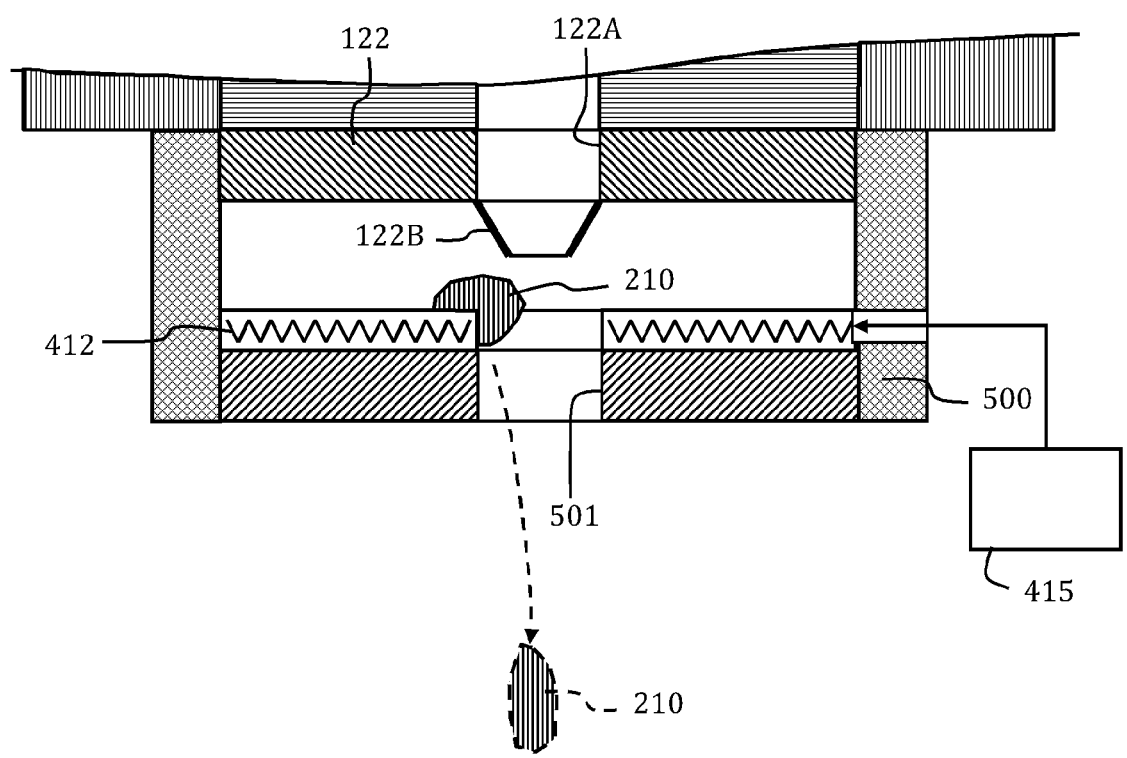
FIG. 8 schematically illustrates the configuration for removing a foreign matter according to a fourth embodiment.

A fourth embodiment will be described with reference to FIG. 8. FIG. 8 is a descriptive view showing the tip of the target supply unit 120 in enlargement. In the fourth embodiment, an annular heater 412 may be provided on an upper surface of the intermediate structure 500. With the fourth embodiment thus configured as well, the foreign matter 201 may be made to melt with the heat from the heater 412 and be removed.

Fifth Embodiment

A fifth embodiment will be described with reference to FIGS. 9 and 10. In the fifth embodiment, the intermediate structure 500 may be heated with the target material 200 stored in the storage 121B, whereby the foreign matter 210 adhering to the intermediate structure 500 may be removed.

Figure 9:
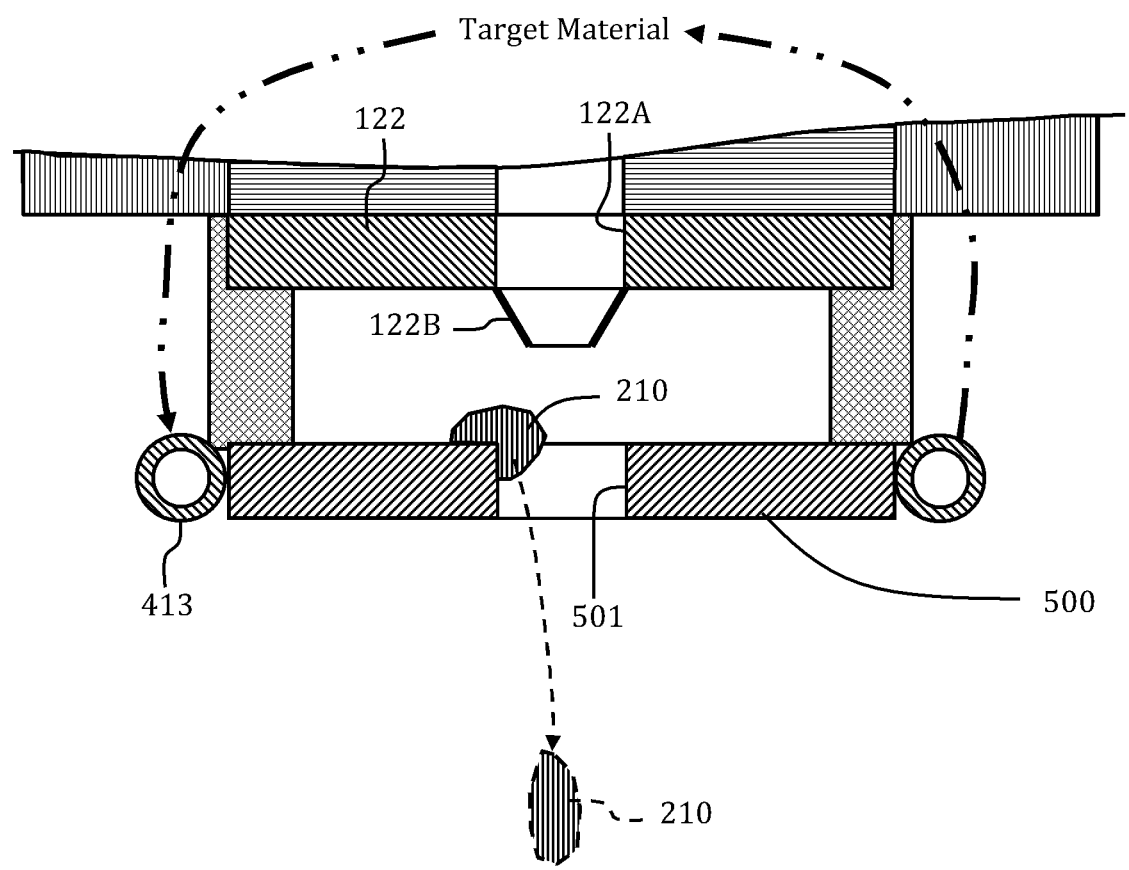
FIG. 9 schematically illustrates the configuration for removing a foreign matter according to a fifth embodiment.

FIG. 9 is a descriptive view showing the tip of the target supply unit 120 in enlargement. An annular heating pipe 413 may be provided so as to surround the outer peripheral surface of the intermediate structure 500. The target material 200 in the molten state stored in the target supply unit 120 may be supplied into the heating pipe 413, which is an example of the recovery unit 400.

The entire intermediate structure 500 may be heated with the heat conducted from the target material 200 flowing in the heating pipe 413. With this, the foreign matter 210 adhering to the intermediate structure 500 may melt and drop.

Figure 10:
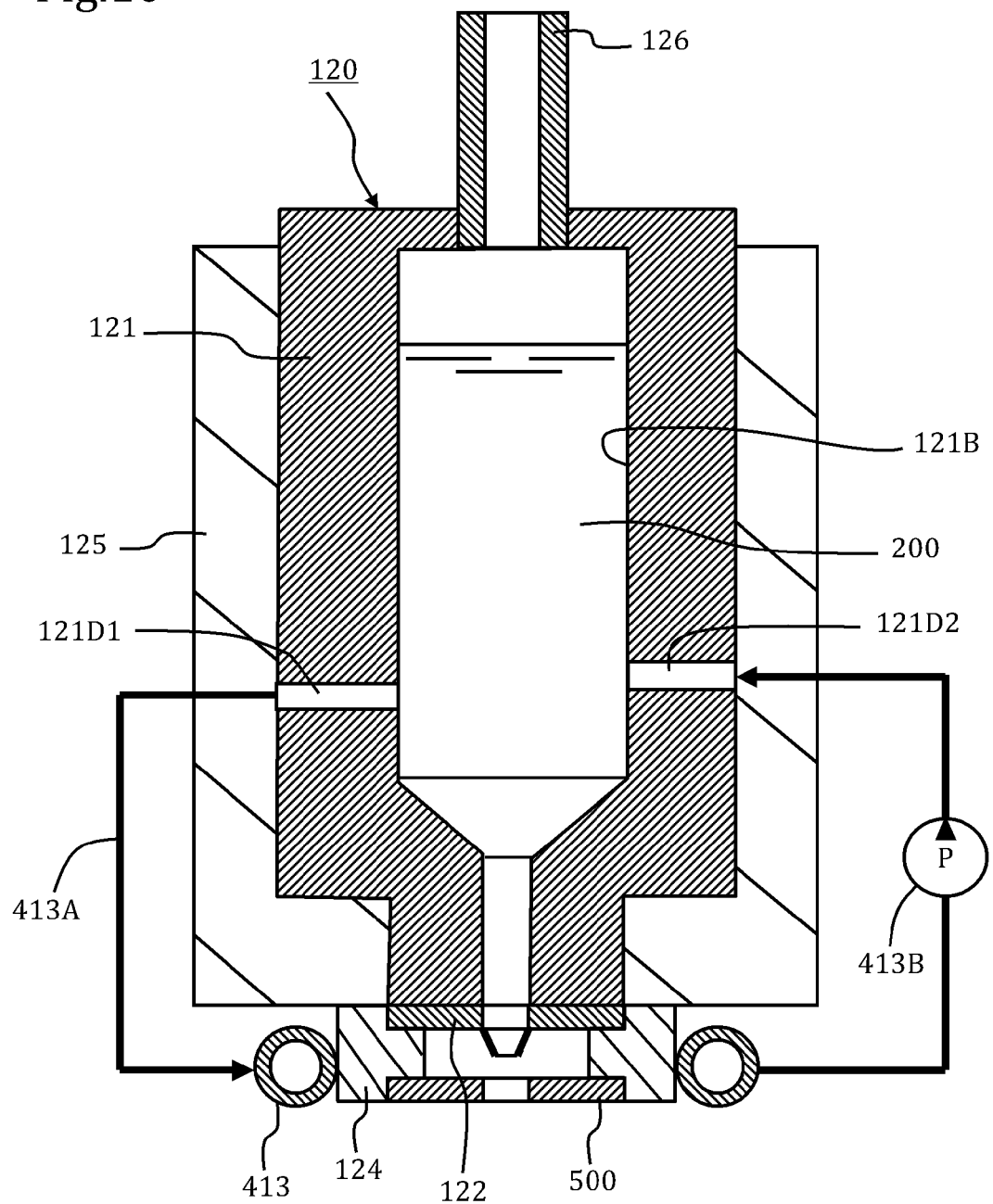
FIG. 10 is an enlarged view of a target supply unit.

The configuration shown in FIG. 10 may correspond to a modification of the fifth embodiment. As shown in FIG. 10, the heating pipe 413 may be provided so as to surround an outer periphery of the insulator 124. The storage 121B may be provided with an outlet port 121D1 through which the target material 200 flows out, and an inlet port 121D2 through which the target material 200 flows in. The heating pipe 413 may be connected to the storage 121B via a channel 413A, the inlet port 121D2, and the outlet port 121D1. The channel 413A may be provided with a pump 413B. A filter unit for removing an impurity in the target material 200 may be provided in the channel 413A.

The target material 200 in the storage 121B may flow into the heating pipe 413 via the outlet port 121D1 and the channel 413A. The target material 200 flowing through the heating pipe 413 may heat the intermediate structure 500 via the insulator 124.

The target material 200, which has heated the intermediate structure 500, may be returned from the heating pipe 413 into the storage 121B via the channel 413A, the pump 413B, and the inlet port 121D2. The target material 200 returned into the storage 121B may be heated by the heating unit 125. The fifth embodiment thus configured may yield an advantage similar to those of the above-described embodiments.

Sixth Embodiment

Figure 11:
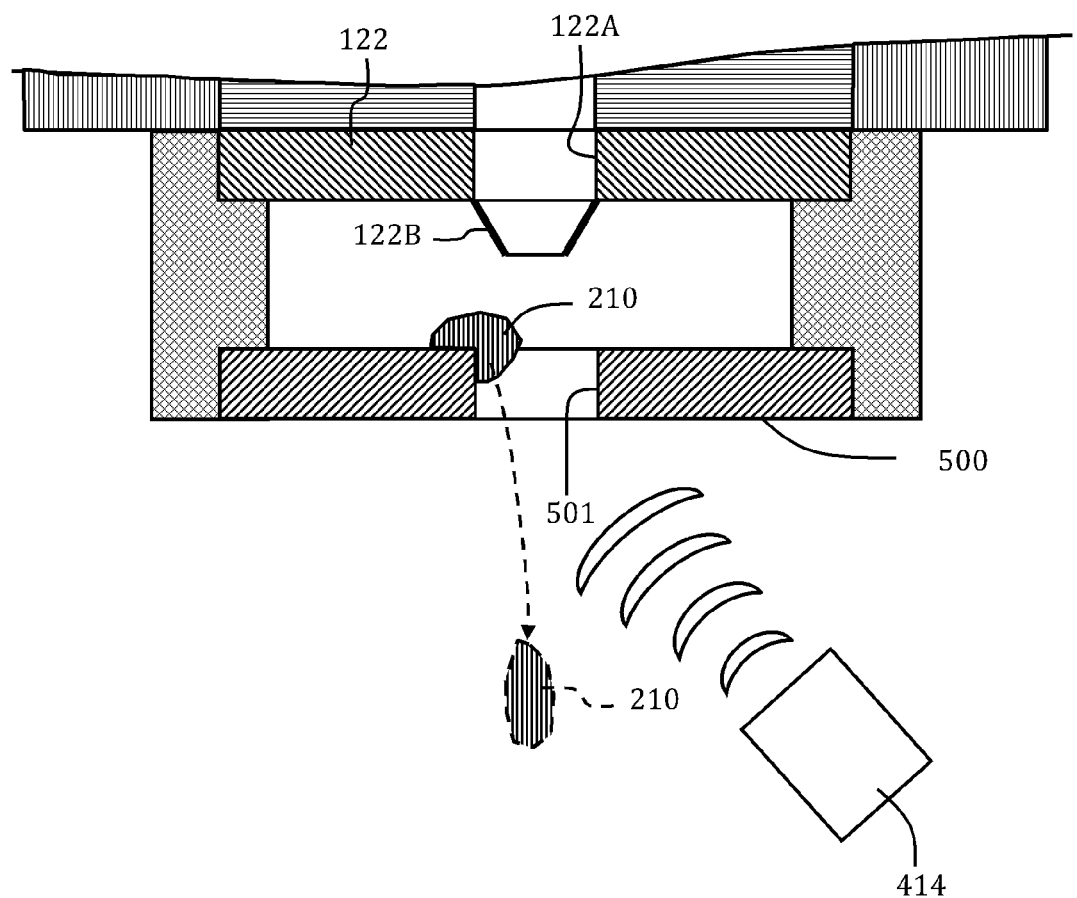
FIG. 11 schematically illustrates the configuration for removing a foreign matter according to a sixth embodiment.

A sixth embodiment will be described with reference to FIG. 11. In the sixth embodiment, the intermediate structure 500 may be heated with an electromagnetic wave source 414, whereby the foreign matter 210 adhering to the intermediate structure 500 may be removed. FIG. 11 is a descriptive view showing the tip of the target supply unit 120 in enlargement.

The electromagnetic wave source 414, which is an example of the recovery unit 400, may output, for example, an electromagnetic wave, such as an infrared laser beam, a microwave, and so forth. The electromagnetic wave outputted from the electromagnetic wave source 414 may strike the intermediate structure 500, whereby the intermediate structure 500 may be heated.

Surface roughness of the intermediate structure 500 may be set so that the electromagnetic wave may be absorbed well by the intermediate structure 500. Alternatively, the configuration may be such that the intermediate structure 500 may be entirely or partly (for part irradiated with the electromagnetic wave) coated with a material that can easily absorb the electromagnetic wave. Further, the configuration may be such that the electromagnetic wave may directly strike the foreign matter 210. The sixth embodiment thus configured may yield an advantage similar to those of the above-described embodiments.

Seventh Embodiment

Figure 12A:
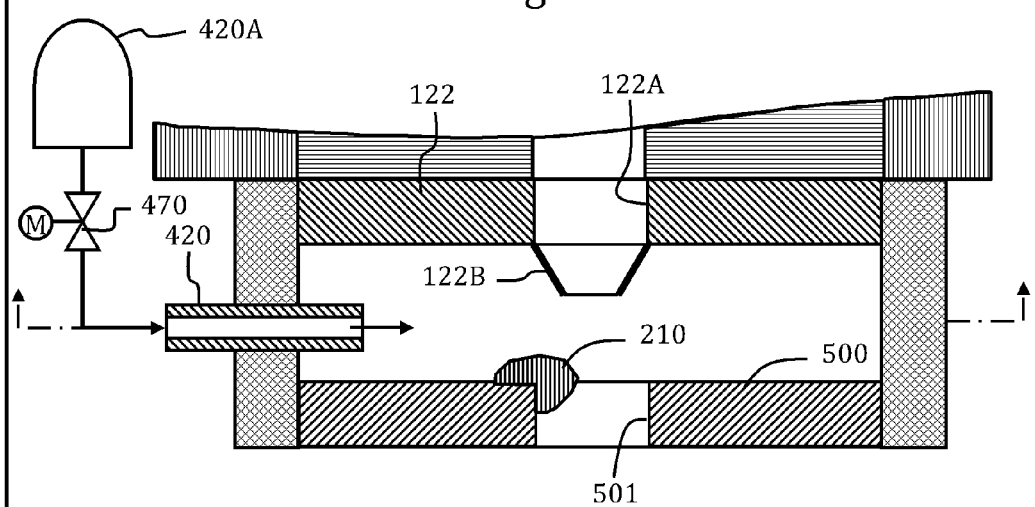
FIG. 12A schematically illustrates the configuration for removing a foreign matter according to a seventh embodiment.
Figure 12B:
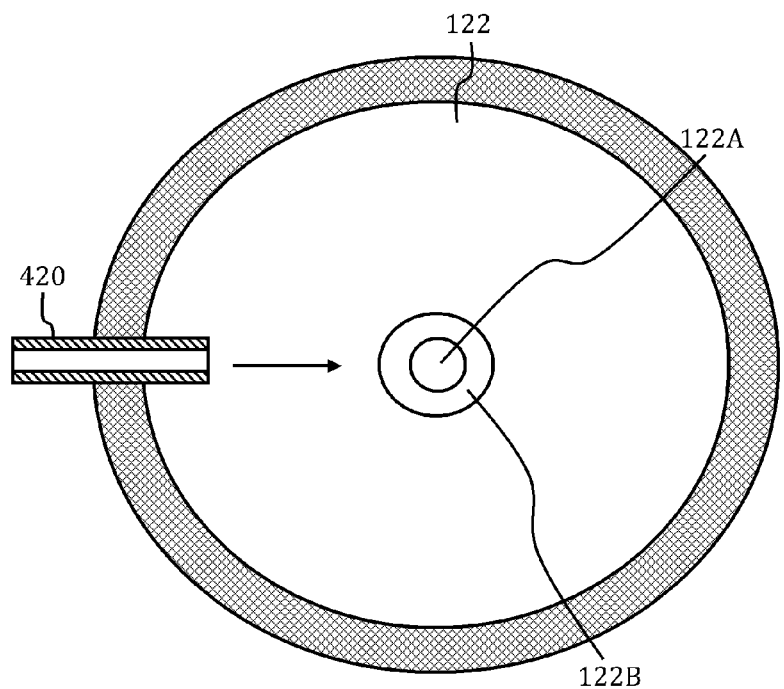
FIG. 12B is a sectional view of a nozzle unit and a gas pipe according to the seventh embodiment.

A seventh embodiment will be described with reference to FIGS. 12A and 12B. In the seventh embodiment, inert gas such as argon gas may be used to blow off and remove the foreign matter 210 adhering to the intermediate structure 500. FIG. 12A is a descriptive view showing the tip of the target supply unit 120 in enlargement. FIG. 12B is a sectional view of the nozzle unit 120 and a gas pipe 420.

As shown in FIG. 12A, a tip of the gas pipe 420, which is an example of the recovery unit 400, may be provided between the intermediate structure 500 and the nozzle unit 122. Gas from a gas source 420A, in which inert gas such as argon gas is stored, may be blown, via the gas pipe 420, into a space between the nozzle unit 120 and the intermediate structure 500 by opening a valve 470, whereby the foreign matter 210 may be removed. The valve 470 may be opened and closed in accordance with a signal from the recovery control unit 301. In the seventh embodiment, the valve 470 is described as a solenoid valve; however, the valve 470 may be a valve that is actuated with air pressure.

The seventh embodiment thus configured may yield an advantage similar to those of the above-described embodiments. In the seventh embodiment, since the gas is blown against the foreign matter 210, whereby the foreign matter 210 may be removed, the intermediate structure 500 may not need to be heated. However, if the intermediate structure 500 is heated and the foreign matter 210 thereon is in the molten state, the foreign matter 210 can be removed more easily.

Eighth Embodiment

Figure 13:
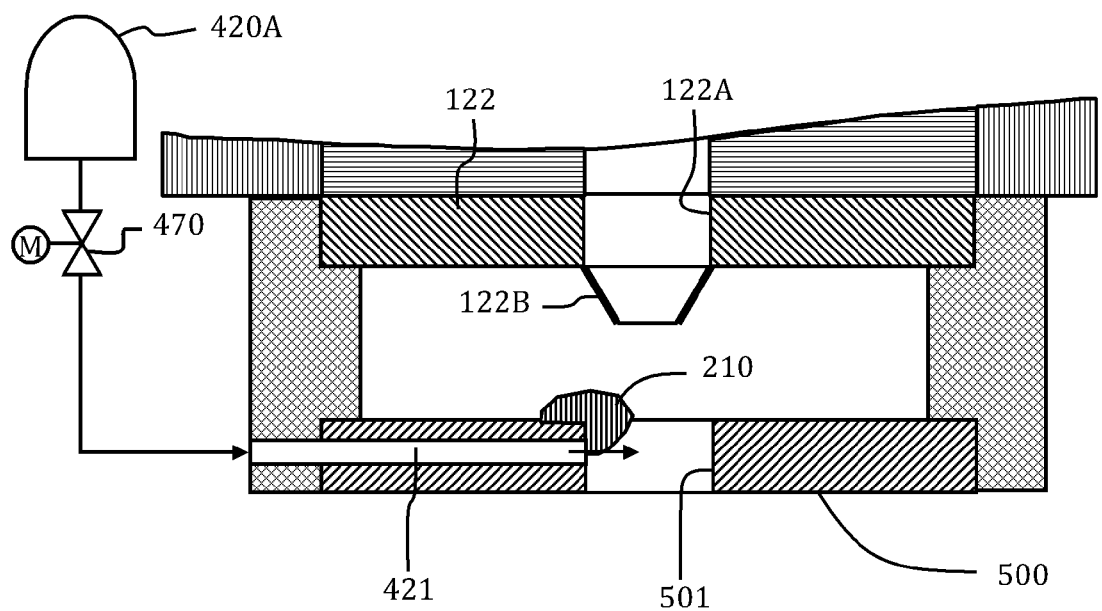
FIG. 13 schematically illustrates the configuration for removing a foreign matter according to an eighth embodiment.

An eighth embodiment will be described with reference to FIG. 13. In the eighth embodiment, a gas channel 421, which is an example of the recovery unit 400, may be provided in the intermediate structure 500. FIG. 13 is a descriptive view showing the tip of the target supply unit 120 in enlargement.

In the intermediate structure 500, the gas channel 421 may be formed in a radial direction thereof. One end of the gas channel 421 may be connected to the gas source 420A. The other end of the gas channel 421 may communicate with an opening 501 formed at the center of the intermediate structure 500.

The inert gas blown through the gas channel 421 toward the opening 501 may blow away and remove the foreign matter 210 adhering to an area around the opening 501. The eighth embodiment thus configured may yield an advantage similar to that of the seventh embodiment.

Ninth Embodiment

A ninth embodiment will be described with reference to FIGS. 14A and 14B. In the ninth embodiment, a gas channel 422, which is an example of the recovery unit 400, may be provided in the insulator 124. FIG. 14A is a descriptive view showing the tip of the target supply unit 120 in enlargement. FIG. 14B is a sectional view of the insulator 124 and the gas channel 422.

In the cylindrical insulator 124, the gas channel 422 may be formed in a radial direction thereof. One end of the gas channel 422 may be connected to the gas source 420A, and the other end of the gas channel 422 may communicate with a space 124A between the nozzle unit 122 and the electrode unit 123.

The inert gas blown through the gas channel 422 into the space 124A may circulate within the space 124A, and blow away the foreign matter 210 in the space 124A. The foreign matter 210, which has been blown away, may be discharged outside through the output hole 123A. The ninth embodiment thus configured may yield an advantage similar to that of the seventh embodiment.

Tenth Embodiment

Figure 15:
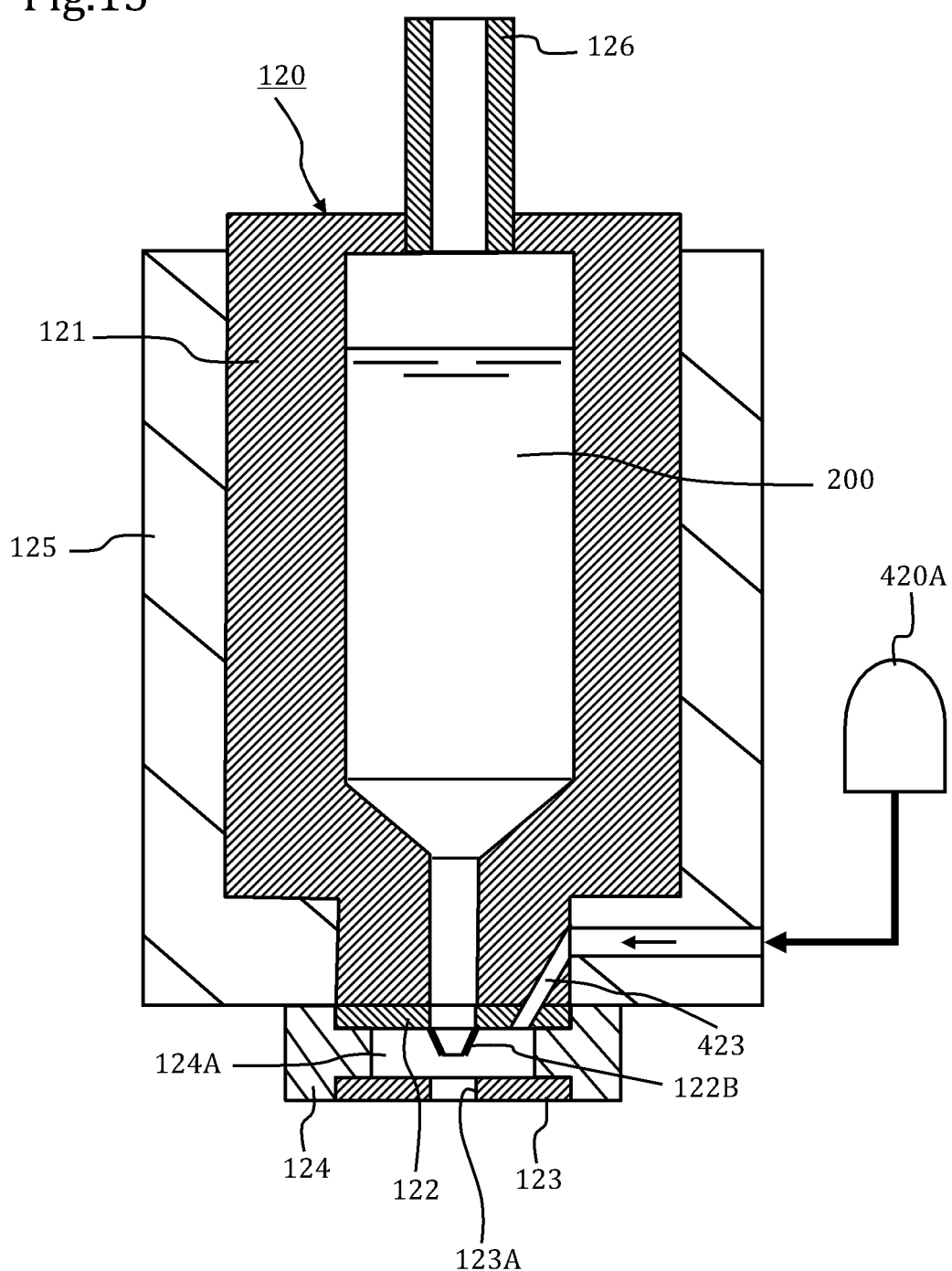
FIG. 15 is a sectional view of a target supply unit according to a tenth embodiment.

A tenth embodiment will be described with reference to FIG. 15. In the tenth embodiment, a gas channel 423, which is an example of the recovery unit, may be provided to the main body 121 of the target supply unit 120. FIG. 15 is a sectional view of the target supply unit 120.

The gas channel 423, for example, may be provided to the target supply unit 120 so as to penetrate through the heating unit 125 and the main body 121. One end of the gas channel 423 may be connected to the gas source 420A, and the other end of the gas channel 423 may communicate with the space 124A between the nozzle unit 122 and the electrode unit 123.

The other end of the gas channel 423 may be provided so as to face an area near the output hole 123A of the electrode unit 123. The inert gas blown through the gas channel 423 may blow away the foreign matter 210 adhering to the area near the output hole 123A and the foreign matter 210 in the space 124A. The foreign matters 210, which have been blown away, may be discharged outside through the output hole 123A. The tenth embodiment thus configured may yield an advantage similar to that of the seventh embodiment.

Eleventh Embodiment

An eleventh embodiment will be described with reference to FIGS. 16A and 16B. The eleventh embodiment may be similar in configuration to the seventh embodiment shown in FIGS. 12A and 12B, and a plurality of the gas pipes 420 may be provided. FIG. 16A is a descriptive view showing the tip of the target supply unit 120 in enlargement. FIG. 16B is a sectional view of the nozzle unit 122 and the gas pipes 420.

As shown in FIG. 16B, the plurality of the gas pipes 420 may be arranged such that the gas pipes 420 are substantially evenly spaced in a circumferential direction to surround the nozzle 122B (in other words, to surround the opening 501 of the intermediate structure 500).

The gas pipes 420 may respectively be connected to the gas source 420A. The inert gas blown through the respective gas pipes 420 may blow away and remove the foreign matter 210 adhering to the intermediate structure 500. Timing at which the inert gas is blown through the gas pipes 420 may be made to differ respectively. For example, the configuration may be such that a given gas pipe 420 being the starting point, the gas pipes 420 may blow the inert gas successively clockwise or counterclockwise. The eleventh embodiment thus configured may yield an advantage similar to that of the seventh embodiment. In the eleventh embodiment, since the inert gas can be blown through the plurality of the gas pipes 420, the performance of removing the foreign matter 210 can be increased, compared with that in the seventh embodiment.

Twelfth Embodiment

A twelfth embodiment will be described with reference to FIGS. 17A and 17B. The twelfth embodiment may be similar in configuration to the ninth embodiment shown in FIGS. 14A and 14B, and a plurality of the gas channels 422 may be provided in the cylindrical insulator 124 such that the gas channels 422 are substantially evenly spaced in the circumferential direction. FIG. 17A is a descriptive view showing the tip of the target supply unit 120 in enlargement. FIG. 17B is a sectional view of the insulator 124 and the gas channels 422.

One end of each gas channel 422 may be connected to the gas source 420A, and the other end of each gas channel 422 may communicate with the space 124A. The inert gas blown through the gas channels 422 into the space 124A may blow away the foreign matter 210 in the space 124A and discharge the foreign matter 210 to the outside through the output hole 123A. Timing at which the inert gas is blown through the gas channels may be set to be the same or different respectively. The twelfth embodiment thus configured may yield an advantage similar to that of the seventh embodiment. In the twelfth embodiment, since the inert gas can be blown through the plurality of the gas channels 422, the performance of removing the foreign matter 210 can be increased, compared with that of the ninth embodiment.

It may be easily understood by those skilled in the art that the plurality of gas channels 423 may be provided even in the configuration of the tenth embodiment shown in FIG. 15, as in the twelfth embodiment.

Thirteenth Embodiment

Figure 18:
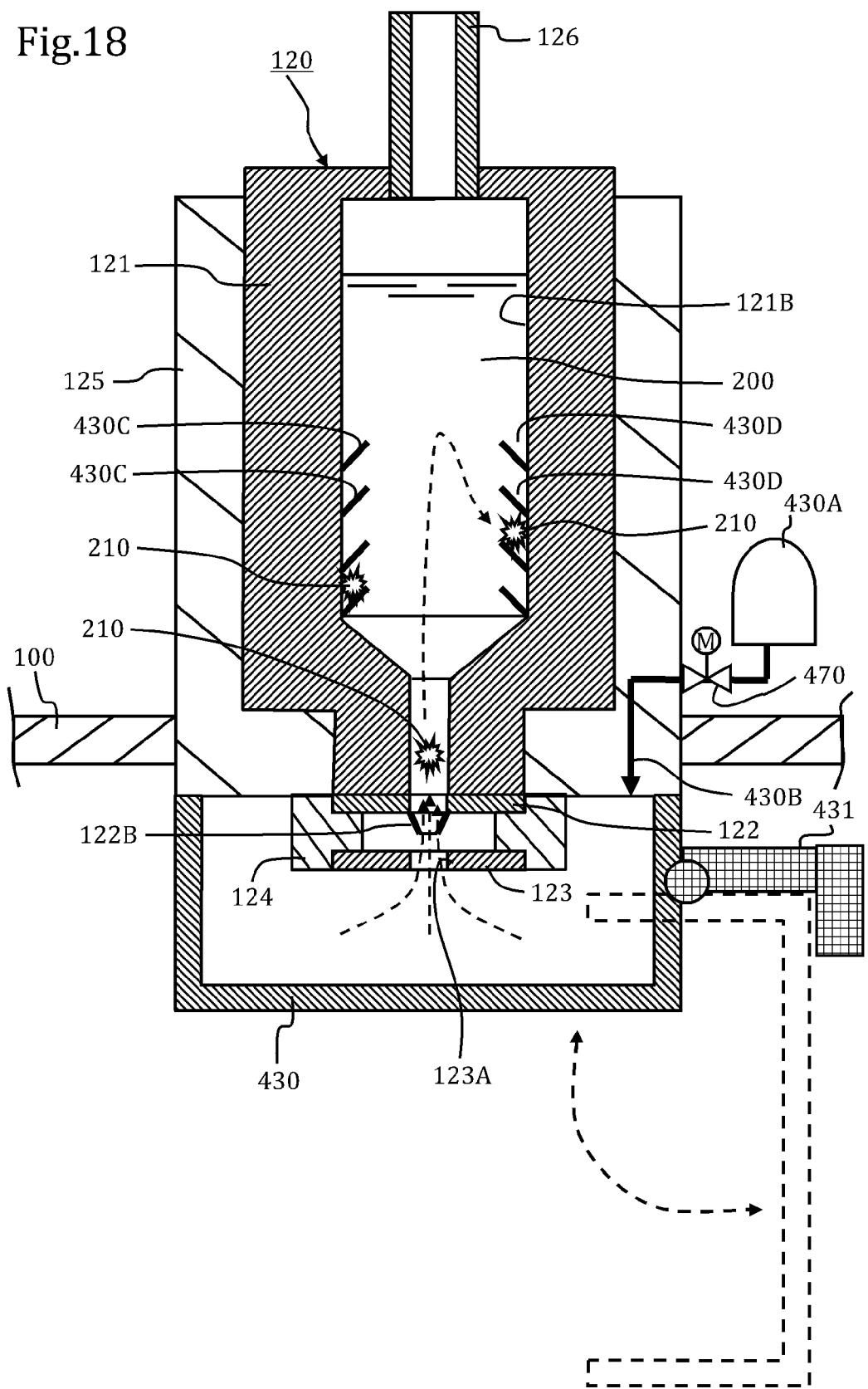
FIG. 18 schematically illustrates the configuration for removing a foreign matter according to a thirteenth embodiment.

A thirteenth embodiment will be described with reference to FIG. 18. In the thirteenth embodiment, the inert gas may be supplied from the outside of the nozzle unit 122 into the nozzle unit 122, whereby the foreign matter 210 in the nozzle unit 122 may be removed. FIG. 18 is a sectional view of the target supply unit 120.

A cover 430 may be provided so as to airtightly cover the nozzle unit 122 and so forth. The cover 430 may be attached by an open/close mechanism 431 such that the cover 430 can be opened and closed. The open/close mechanism 431 may cause the cover 430 to cover the nozzle unit 122 and so forth, or may release the cover 430 from the nozzle unit 122 and so forth. The open/close mechanism 431 may, for example, be configured of a motor, a cylinder, a link mechanism, and so forth.

A gas source 430A may be connected to the interior of the cover 430 via a gas channel 430B. A plurality of traps 430C for trapping the foreign matter 210 may be provided on an inner wall of the main body 121. Each trap 430C may be configured, for example, as a tapered ring. Each trap 430C is preferably mounted such that a space 430D opening upwardly is formed between the trap 430C and the inner wall of the main body 121.

In the thirteenth embodiment, the cover 430, the gas source 430A, the gas channel 430B, the traps 430C, and the open/close mechanism 431 may configure the recovery unit 400.

In the recovery mode, the open/close mechanism 431 may be actuated and hence the nozzle unit 122 and so forth may airtightly be covered with the cover 430, and then the inert gas may be sent from the gas source 430A into the space in the cover 430. At this time, the gas pressure in the cover 430 may preferably be higher than the pressure in the storage 121B. The inert gas sent into the cover 430 may flow into the storage 121B via the nozzle unit 122 and so forth. At this time, the foreign matter 210 in the nozzle unit 122 may be pushed into the storage 121B.

At least part of a plurality of the foreign matters 210 pushed into the storage 121B, while floating in the target material 200, may be trapped in any of the plurality of the traps 430C and stored in the space 430D.

The thirteenth embodiment thus configured may yield an advantage similar to those of the above-described embodiments. In the thirteenth embodiment, by blowing the inert gas from the outside into the cover 430, the foreign matter 210 in the nozzle unit 122 can be pushed back into the storage 121B. Further, at least part of the foreign matter 210 pushed back into the storage 121B can be trapped in any of the plurality of the traps 430C. With this, the foreign matter 210 may be removed from the nozzle unit 122, and the function of the target supply unit 120 can be recovered to the normal state. Here, the function subject to recovery is mainly a function of accurately sending the droplet 201 to the plasma generation region 202.

Fourteenth Embodiment

Figure 19:
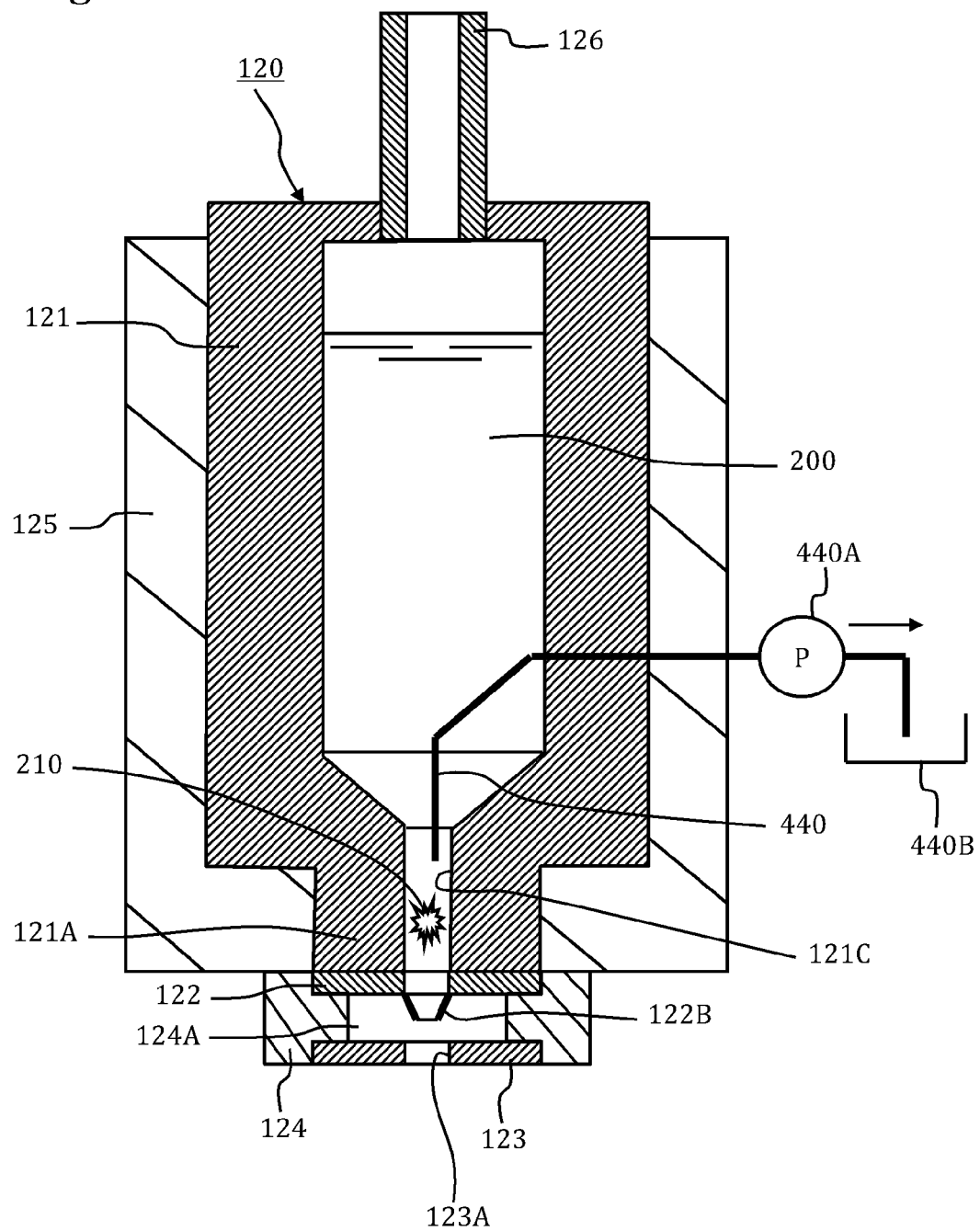
FIG. 19 is a sectional view of a target supply unit according to a fourteenth embodiment.

A fourteenth embodiment will be described with reference to FIG. 19. In the fourteenth embodiment, the configuration may be such that the foreign matter 210 in the nozzle unit 122 is sucked to the outside. FIG. 19 is a sectional view of the target supply unit 120.

The target supply unit 120 may be provided with a suction tube 440. One end of the suction tube 440 may extend toward the output channel 121C in the tip 121A. The other end of the suction tube 440 may be provided with a suction pump 440A. Further, a collection tank 440B for collecting thereinto the foreign matter 210 and the target material 200 sucked by the suction tube 440. In the fourteenth embodiment, the suction tube 440, the suction pump 440A, and the collection tank 440B may configure the recovery unit 400.

When the suction pump 440A is actuated, a value (not shown) located between the suction pump 440A and the target supply unit 120 is opened, and hence the foreign matter 210 and the target material 200 suspended at the tip of the target supply unit 120 may be sucked through the tip of the suction tube 440 and discharged into the collection tank 440B. The collected target material 200 may be re-used after having the foreign matter 210 removed therefrom.

In the fourteenth embodiment thus configured, since the foreign matter 210 in the target supply unit 120 is sucked and removed, the maintenance on the target supply unit 120 can be performed automatically and the usability of the device can be increased, as in the first embodiment.

Fifteenth Embodiment

A fifteenth embodiment will be described with reference to FIGS. 20A and 20B. FIGS. 20A and 20B are sectional views showing the nozzle unit 122 in enlargement. In the fifteenth embodiment, by applying vibration to the nozzle unit 122, the foreign matter 210 suspended in the nozzle unit 122 may be crushed and discharged outside. In FIGS. 20A and 20B, the insulator 124 and the electrode unit 123 are omitted for the sake of simplicity.

A vibrator 450, which is an example of the recovery unit 400, may be provided at an outer periphery side of the nozzle 122B. The vibrator 450 may vibrate in accordance with voltage from a high-frequency power supply 450A. As shown in FIG. 20A, when the vibrator 450 vibrates, the foreign matter 210 may be crushed into small pieces by the vibration. As shown in FIG. 20B, the foreign matter 210, which has been crushed into small pieces, may be discharged outside of the nozzle 122B.

With the fifteenth embodiment thus configured as well, the maintenance on the target supply unit 120 can be performed automatically, and an advantage similar to that of the first embodiment may be yielded.

Sixteenth Embodiment

A sixteenth embodiment will be described with reference to FIGS. 21A and 21B. In the sixteenth embodiment, by heating the nozzle unit 122, the foreign matter 210 suspended in the nozzle unit 122 may be molten and discharged. FIGS. 21A and 21B are sectional views showing the nozzle unit 122 in enlargement. A heater 460, which is an example of the recovery unit 400, may be provided at the outer periphery side of the nozzle 122B.

As shown in FIG. 21A, the heater 460 generates heat with the electric power supplied from a heater power supply 460A. The heater 460 is heated to a temperature at which the foreign matter 210 is molten. As shown in FIG. 21B, the molten foreign matter may be discharged outside through the nozzle 122B. The sixteenth embodiment thus configured as well may yield an advantage similar to that of the fifteenth embodiment.

Seventeenth Embodiment

A seventeenth embodiment will be described with reference to FIGS. 22A and 22B. In the seventeenth embodiment, at least a surface of an intermediate structure 510 may be formed of a material to which the target material 200 is hard to adhere. FIGS. 22A and 22B are descriptive views showing the tip of the target supply unit 120 in enlargement.

The surface of the intermediate structure 510 may be coated with a material with a low wettability to the target material 200 (material with a large contact angle to the target material). The entire intermediate structure 510 may be formed of a material with a low wettability to the target material 200. When the target material 200 is tin, the material with a low wettability to the target material 200 may include, for example, molybdenum, tantalum, alumina ceramics, and so forth. Alternatively, the intermediate structure 510 may be configured of ceramics containing, as a main component, silicon carbide, silicon nitride, aluminum oxide, zirconium oxide, diamond, silicon oxide, molybdenum oxide, tantalum oxide, tungsten oxide, and so forth.

As shown in FIG. 22A, the intermediate structure 510 may be formed in a downwardly converging frustoconical shape. There may be a case where the entirety or part of the droplet 201 discharged through the nozzle 122B may adhere to an upper surface of the intermediate structure 510 and become the foreign matter 210. The foreign matter 210 may slide on the surface of the intermediate structure 510, and drop through the opening 501.

As shown in FIG. 22B, an intermediate structure 511 may be formed in an upwardly converging frustoconical shape. In this case, the foreign matter 210 adhering to the surface of the intermediate structure 511 may slide toward an outer edge of the intermediate structure 511, and drop from the outer edge of the intermediate structure 511. The foreign matter 210 adhering to an area near the opening 501 may drop through the opening 501.

The seventeenth embodiment thus configured may be combined with other embodiments of this disclosure, with which the maintenance on the target supply unit 120 can be performed automatically, and the usability of the device may be increased.

Eighteenth Embodiment

An eighteenth embodiment will be described with reference to FIGS. 23A through 23C. In the eighteenth embodiment, the foreign matter 210 in the nozzle unit 122 may be discharged outside in the recovery mode.

FIGS. 23A through 23C are descriptive views showing a method for pushing out the foreign matter 210 through the nozzle unit 122. As shown in FIG. 23A, There may be a case where the foreign matter 210 is suspended around the nozzle unit 122. Thus, as shown in FIG. 23B, the pressure in the nozzle unit 122 may temporarily be increased. With this, as shown in FIG. 23C, the foreign matter 210 suspended in the nozzle unit 122 may be pushed out.

Several methods are conceivable as a method for discharging the foreign matter in the nozzle unit 122 to the outside. A first method is a method in which gas pressure applied into the storage 121B is increased, whereby the pressure inside the nozzle unit 122 is increased and the foreign matter 210 is discharged. A second method is a method in which a member constituting a channel for the target material, including the nozzle unit 122, is deformed within a range of elastic deformation and the volume inside the channel for the target material is decreased, whereby the pressure inside the nozzle unit 122 is increased and the foreign matter 210 is discharged. A third method is a method in which an electrode such as the electrode unit 123 is provided and the foreign matter 210 is discharged with electrostatic attractive force. The above-described methods may be combined.

With the eighteenth embodiment thus configured as well, the maintenance on the target supply unit 120 can be performed automatically, and the usability of the device may be increased.

Nineteenth Embodiment

A nineteenth embodiment will be described with reference to FIGS. 24 through 25B. In the nineteenth embodiment, a trap unit 600 for trapping the foreign matter 210 removed from the target supply unit 120 may be provided. FIG. 24 is a descriptive view schematically showing the relationship among the target supply unit 120, the trap unit 600, and the collector mirror 130. FIGS. 25A and 25B are descriptive views showing the configuration for switching the positions of the trap unit 600. It is to be noted that a collection unit 170 shown in FIG. 24 may be a device for collecting a droplet 201 that is not irradiated with a laser beam, from among droplets 201 outputted from the target supply unit 120 in the normal mode.

As shown in FIG. 24, the trap unit 600 may be provided between the target supply unit 120 and the collector mirror 130. The trap unit 600 may receive the foreign matter 210 removed and dropped from the target supply unit 120, and prevent the foreign matter 210 from adhering to the collector mirror 130.

The trap unit 600 may, for example, include a shutter 601 and a motor 602 for rotating the shutter 601. The shutter 601 may be formed in a flat plate shape, or in a dish-like shape with the center thereof being recessed. When the shutter 601 is formed in the dish-like shape, the foreign matter 210 collected on the shutter 601 can be further effectively prevented from being scattered around by centrifugal force generated when the shutter 601 is rotated.

FIG. 25A shows the position of the shutter 601 in the recovery mode. This position is referred to as a first position or a trap position. When the shutter 601 is at the first position, the foreign matter 210 removed from the target supply unit 120 may be trapped on the shutter 601. With this, the foreign matter 210 can be prevented from adhering to the collector mirror 130.

FIG. 25B shows the position of the shutter 601 in the normal mode. This position is referred to as a second position or a normal position. When the shutter 601 is at the second position, the droplet 201 outputted from the target supply unit 120 can move toward the plasma generation region 202. Accordingly, when the shutter 601 is at the second position, the path of the droplet 201 outputted from the target supply unit 120 may not be blocked, and the EUV light may be generated in the plasma generation region 202.

With the nineteenth embodiment thus configured, the foreign matter 210 removed from the target supply unit 120 can be prevented from adhering to the collector mirror 130. Accordingly, by desirably combining this embodiment with any of the above-described embodiments for removing the foreign matter 210, the efficiency of the maintenance work can be increased, and the usability of the device may be increased.

Twentieth Embodiment

Figure 26:
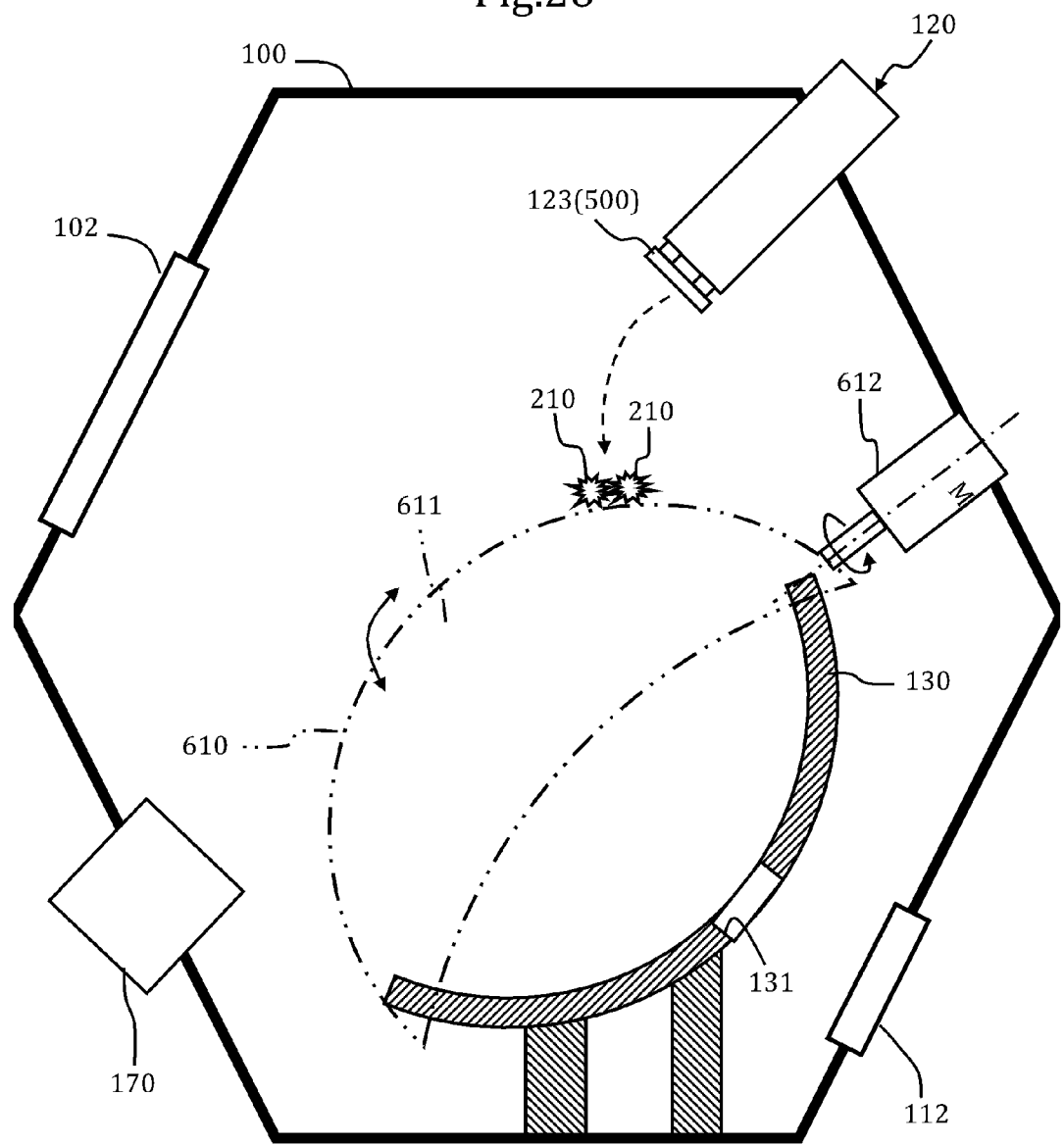
FIG. 26 is a descriptive view schematically illustrating the configuration for protecting a collector mirror from a foreign matter according to a twentieth embodiment.

A twentieth embodiment will be described with reference to FIG. 26. In the twentieth embodiment, a mirror protection unit 610 for protecting a surface of the collector mirror 130 may be provided. FIG. 26 is a descriptive view schematically showing the relationship among the target supply unit 120, the mirror protection unit 610, and the collector mirror 130.

The mirror protection unit 610 may include a dome-like shutter 611 and a motor 612 for rotating the shutter 611. In the normal mode, the shutter 611 may stand by at a position at which the shutter 611 does not block the optical path of the EUV light. The shutter 611 may preferably stand by at a position at which the shutter 611 does not adversely affect the generation of plasma, the emission of the EUV light, and the collection of the EUV light.

In the recovery mode, the motor 612 may move the shutter 611 to a position at which the shutter 611 covers a reflection surface of the collector mirror 130. With this, the shutter 611 may shield between the collector mirror 130 and the target supply unit 120, and protect the collector mirror 130 from the foreign matter 210 removed from the target supply unit 120. The twentieth embodiment thus configured may yield an advantage similar to that of the nineteenth embodiment.

Twenty-First Embodiment

Figure 27:
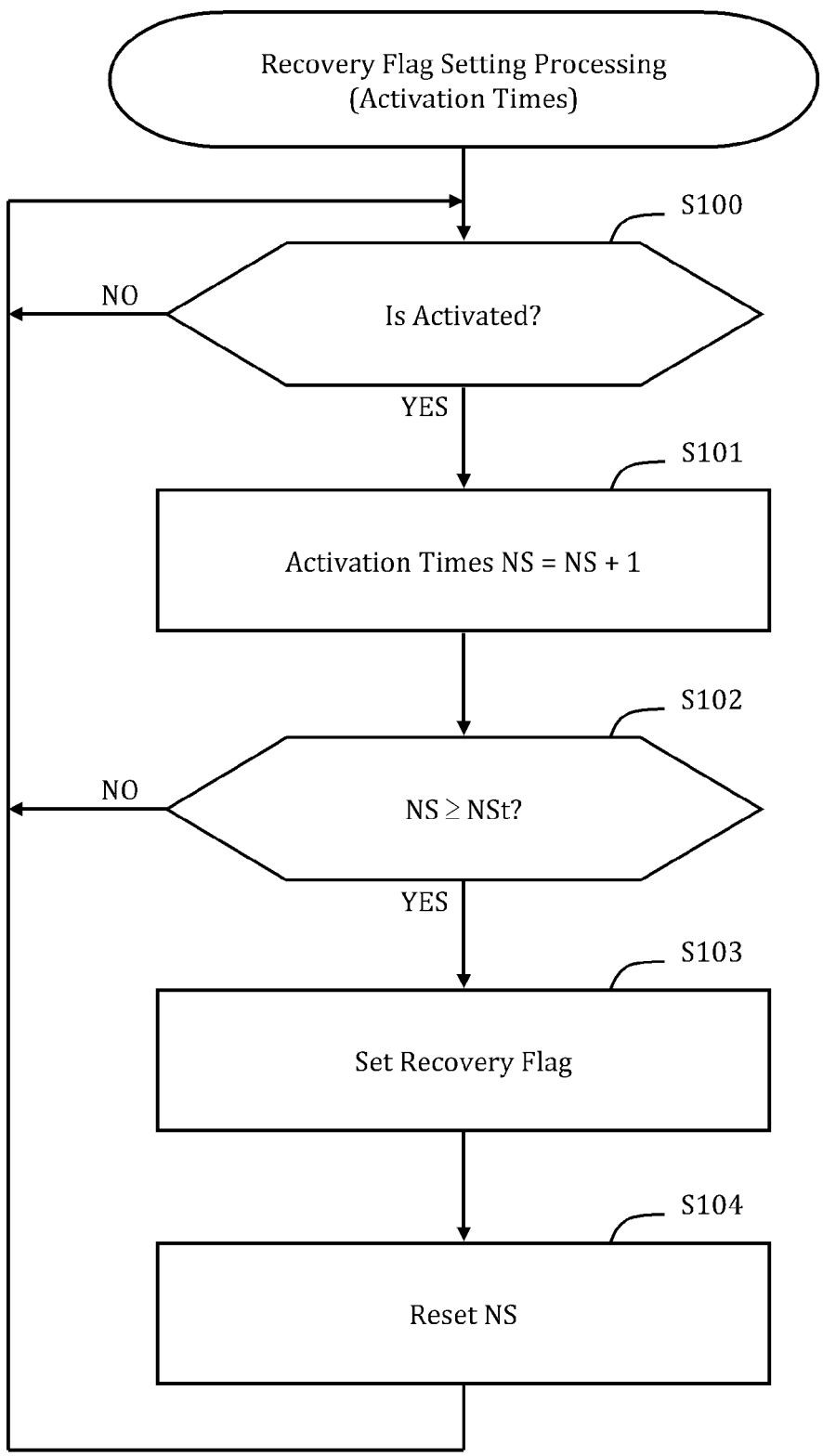
FIG. 27 is a flowchart of processing for setting a recovery flag.

A twenty-first embodiment will be described with reference to the flowchart shown in FIG. 27. Embodiments described below including the twenty-first embodiment are specific examples of the recovery flag setting processing described with reference to FIG. 3.

If the target supply unit 120 is activated (S100: YES), the recovery control unit 301 may increment the value of a counter NS that integrates the number of activation times by one (NS=NS+1, S101). Then, the recovery control unit 301 may determine whether or not the number of activation times NS has reached a predetermined threshold NSt (NS≧NSt, S102).

If the number of activation times NS has reached the threshold NSt (S102: YES), the recovery control unit 301 may set the recovery flag (S103), and reset the number of activation times NS (S104).

In this way, the recovery flag may be set when the target supply unit 120 is activated by the predetermined number, and thus the maintenance on the target supply unit 120 can be performed automatically.

Twenty-Second Embodiment

Figure 28:
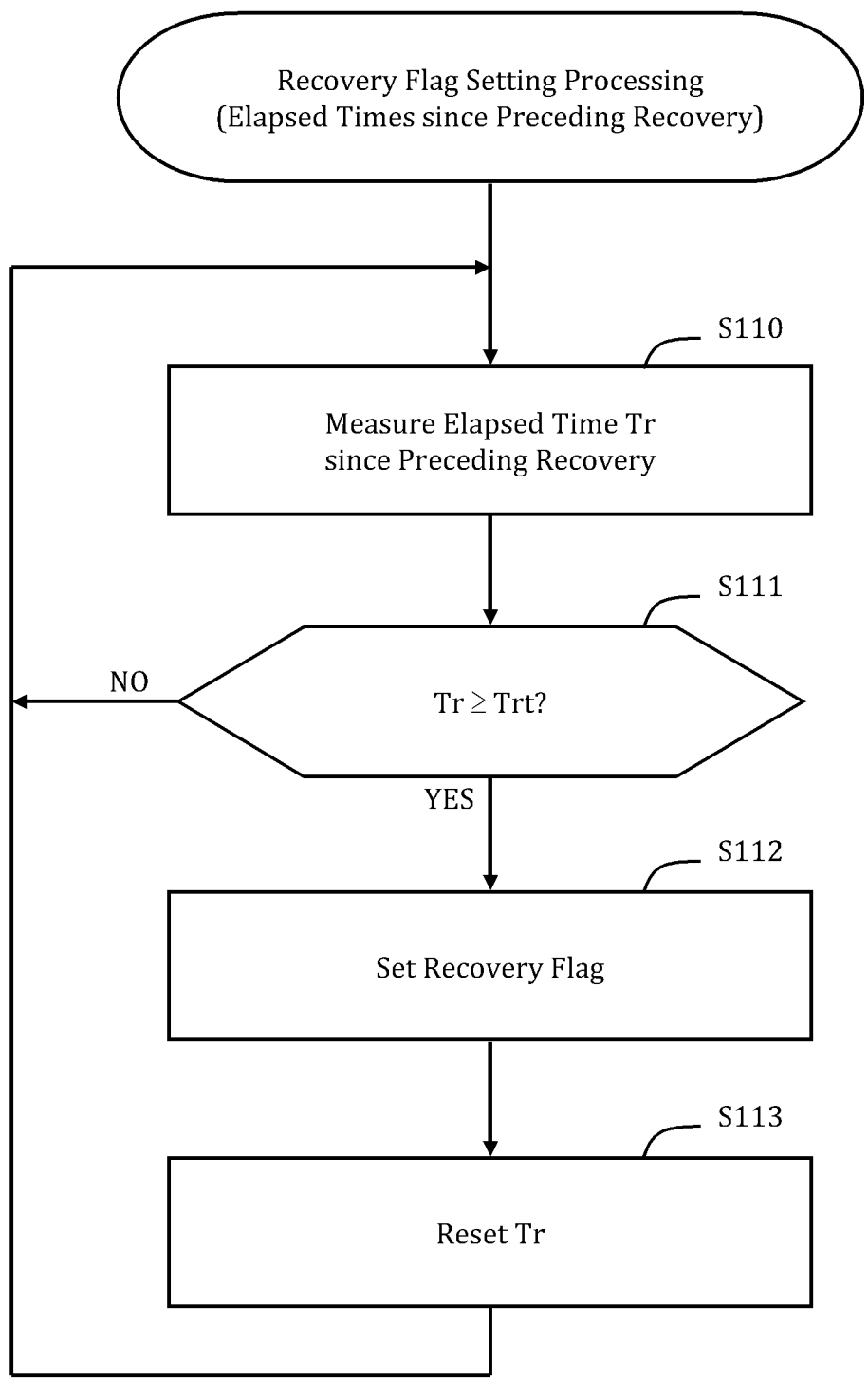
FIG. 28 is a flowchart of another processing for setting a recovery flag.

A twenty-second embodiment will be described with reference to the flowchart shown in FIG. 28. The recovery control unit 301 may include a timer, and may time an elapsed time Tr since the execution of the preceding recovery operation (or the execution of the maintenance work) (S110). The recovery control unit 301 may determine whether or not the elapsed time Tr has reached a predetermined elapsed time Trt (Tr≧Trt, S111).

If the elapsed time Tr since the execution of the preceding recovery operation has reached the predetermined elapsed time Trt (S111: YES), the recovery control unit 301 may set the recovery flag (S112), and reset the elapsed time Tr (S113).

In this way, the recovery flag may be set when the elapsed time Tr since the execution of the preceding recovery operation has reached the predetermined elapsed time Trt, and thus the maintenance on the target supply unit 120 can be performed automatically.

Twenty-Third Embodiment

Figure 29:
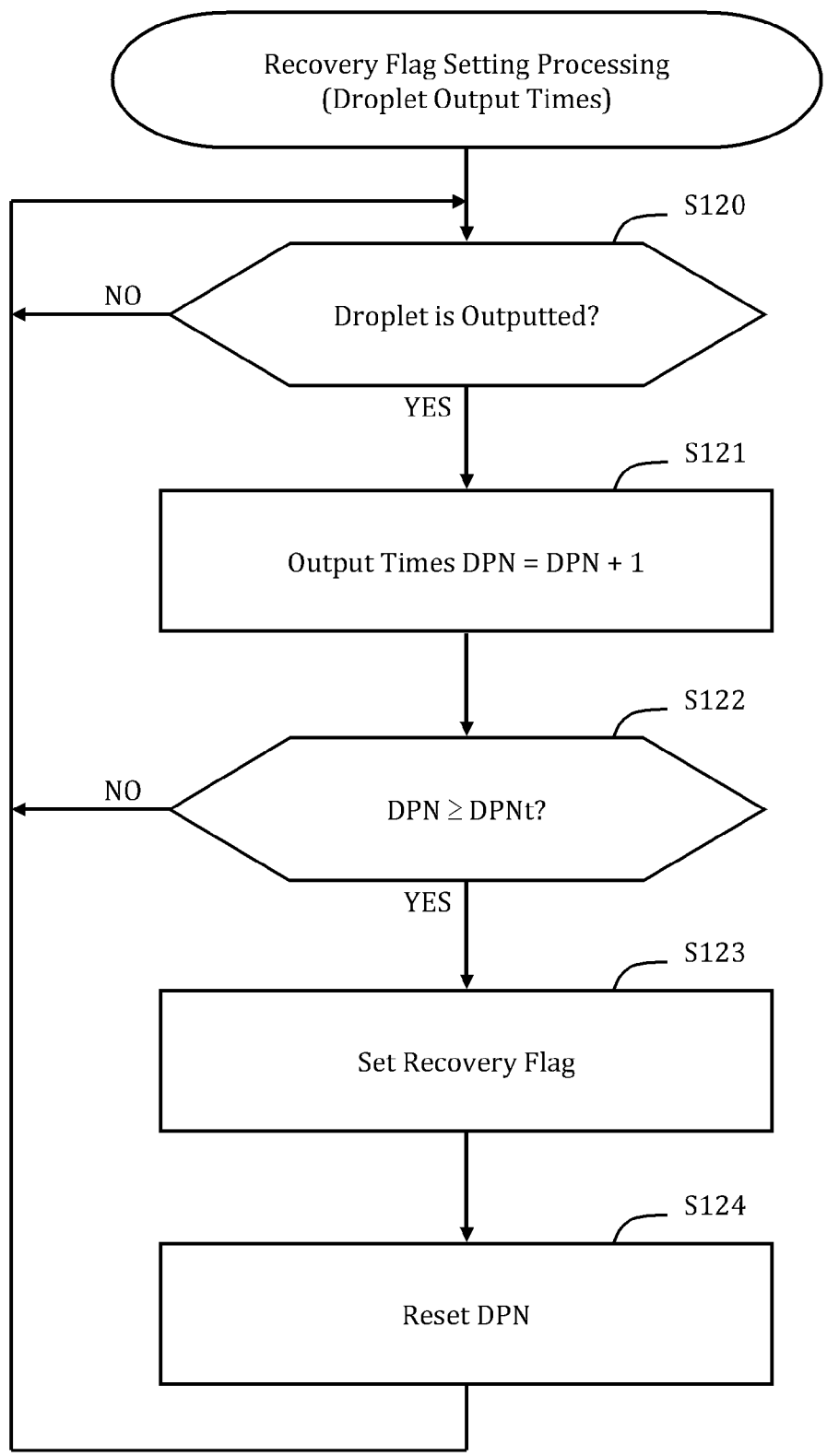
FIG. 29 is a flowchart of yet another processing for setting a recovery flag.

A twenty-third embodiment will be described with reference to the flowchart shown in FIG. 29. The recovery control unit 301 may monitor the output of the droplet 201 from the target supply unit 120 (S120). If the droplet 201 is outputted from the target supply unit 120 (S120: YES), the recovery control unit 301 may increment the value of a counter DPN that integrates the number of output times by one (DPN=DPN+1, S121).

The recovery control unit 301 may determine whether or not the number of droplet output times DPN has reached a predetermined number of output times DPNt (DPN≧DPNt, S122). The number of droplet output times may be calculated as the number of times an output pulse of the pulse control unit 320 shown in FIG. 1 and a detection signal of the position detection sensor 340 are both detected. If the number of droplet output times DPN has reached the predetermined number of output times DPNt (S122: YES), the recovery control unit 301 may set the recovery flag (S123), and reset the number of droplet output times DPN (S124).

In this way, when the number of output times DPN of the droplets 201 from the target supply unit 120 has reached the predetermined number DPNt, the maintenance on the target supply unit 120 can be performed automatically.

Twenty-Fourth Embodiment

Figure 30:
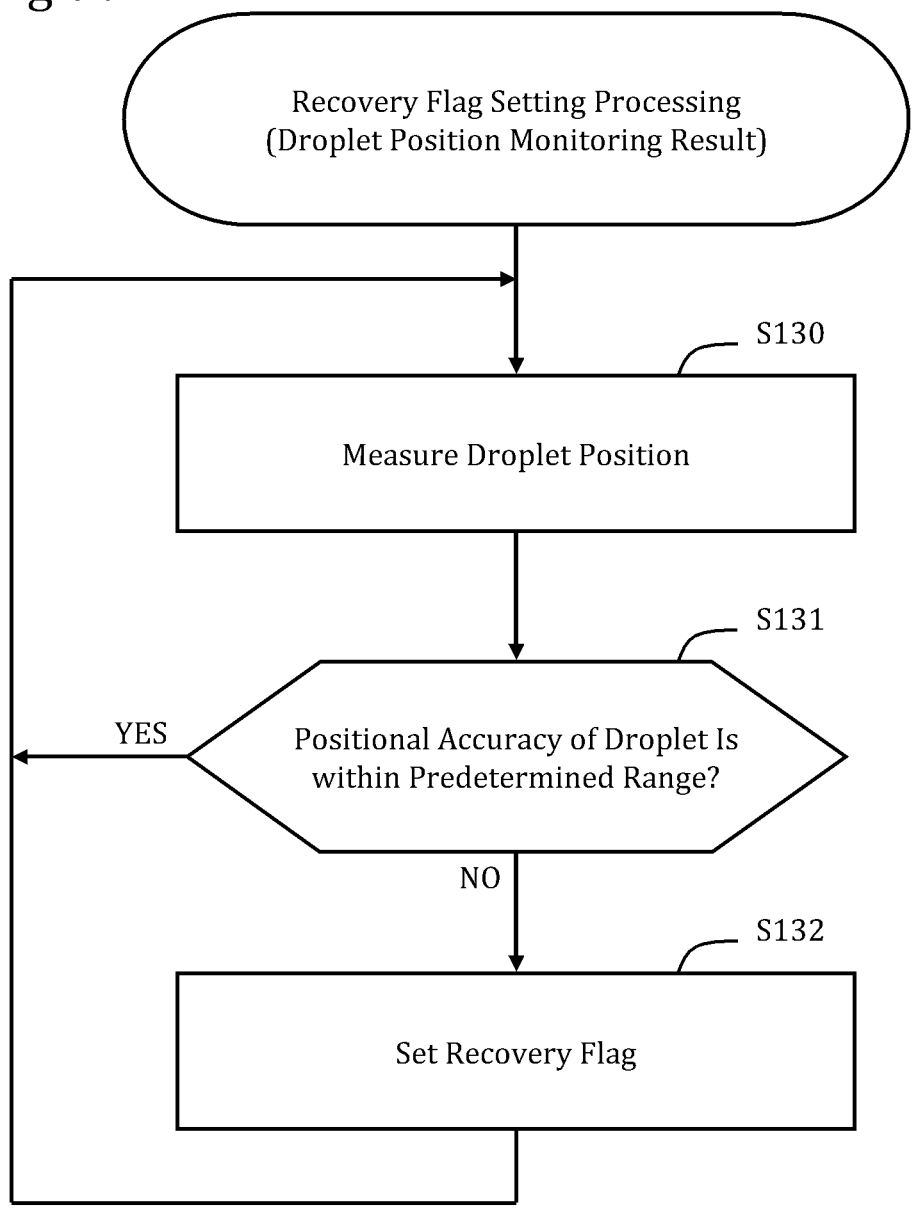
FIG. 30 is a flowchart of still another processing for setting a recovery flag.

A twenty-fourth embodiment will be described with reference to the flowchart shown in FIG. 30. The recovery control unit 301 may measure the position of the droplet 201 via the position measuring unit 302 (S130). The recovery control unit 301 may determine whether or not the positional accuracy of the droplet 201 is within a predetermined range (S131). Further, whether or not the droplet 201 has been outputted with an output instruction from the droplet controller 310 may be determined.

If the positional accuracy of the droplet 201 is not within the predetermined range (S131: NO), the recovery control unit 301 may set the recovery flag (S132). A condition under which it is determined as NO in S131 may be a case in which the droplet 201 is not detected although the output instruction is given by the droplet controller 310. In this way, when the position of the droplet 201 outputted from the target supply unit 120 becomes unstable or when the droplet is not outputted, the maintenance on the target supply unit 120 can be performed automatically.

This disclosure is not limited to the above-described embodiments. Those skilled in the art can make various additions, modifications, and so forth within the scope of this disclosure. For example, the above-described embodiments may appropriately be combined.

For example, an embodiment in which a foreign matter is heated (second embodiment, third embodiment, fourth embodiment, fifth embodiment, sixth embodiment) may appropriately be combined with an embodiment in which inert gas is blown against a foreign matter (seventh embodiment, eighth embodiment, ninth embodiment, tenth embodiment, eleventh embodiment, twelfth embodiment). This is because the foreign matter can be easily removed if the inert gas is blown while flowability is increased by heating the foreign matter.

Further, in the thirteenth embodiment in which the inert gas is flowed in from the outside of the nozzle, or in the fourteenth embodiment in which the foreign matter in the nozzle is sucked, the configuration for heating the foreign matter may additionally be provided.

Furthermore, by combining the first through sixteenth embodiments with the seventeenth embodiment in which the material with the low wettability to the target material is used for the intermediate structure, the foreign matter adhering thereonto can be more effectively removed.

Further, by combining the first through eighteenth embodiments with the nineteenth embodiment in which the foreign matter trap unit is provided, or with the twentieth embodiment in which the mirror protection unit is provided, the foreign matter removed from the target supply unit can be prevented from adhering to the collector mirror.

The above description is non-limiting and is illustrative. Accordingly, it may be apparent to those skilled in the art that various modifications can be added to the embodiments of this disclosure without departing from the scope of this disclosure. The terms used herein and the appended claims should be interpreted as "non-limiting." For example, the terms "include" or "included" should be interpreted as "not limited to the elements described as being included." The term "have" should be interpreted as "not limited to the elements described as being had." Further, the modifier used herein and the appended claims "a/one" should be interpreted as at least one or "one or more."

What is claimed is:

1. A chamber apparatus used with a laser apparatus, comprising:
   a chamber provided with at least one inlet for introducing thereinto a laser beam outputted from the laser apparatus;
   a target supply unit provided to the chamber for supplying a target material to a predetermined region in the chamber;
   a recovery control unit for instructing the target supply unit to execute recovery operation if a predetermined condition is met;
   a recovery unit for executing the recovery operation in response to the instruction from the recovery control unit; and
   a position measuring unit for measuring a position of the target material supplied from the target supply unit into the chamber, wherein
   the recovery control unit includes a counter for counting the number of activation times of the target supply unit, and
   the predetermined condition is that the number of the activation times of the target supply unit has reached a predetermined number of the activation times.

2. A chamber apparatus used with a laser apparatus, comprising:
   a chamber provided with at least one inlet for introducing thereinto a laser beam outputted from the laser apparatus;
   a target supply unit provided to the chamber for supplying a target material to a predetermined region in the chamber;
   a recovery control unit for instructing the target supply unit to execute recovery operation if a predetermined condition is met;
   a recovery unit for executing the recovery operation in response to the instruction from the recovery control unit; and
   a position measuring unit for measuring a position of the target material supplied from the target supply unit into the chamber, wherein
   the recovery control unit includes a timer for measuring an elapsed time since execution of recovery operation, and
   the predetermined condition is that a predetermined time has elapsed since execution of preceding recovery operation.

3. A chamber apparatus used with a laser apparatus, comprising:
   a chamber provided with at least one inlet for introducing thereinto a laser beam outputted from the laser apparatus;
   a target supply unit provided to the chamber for supplying a target material to a predetermined region in the chamber;
   a recovery control unit for instructing the target supply unit to execute recovery operation if a predetermined condition is met;
   a recovery unit for executing the recovery operation in response to the instruction from the recovery control unit; and
   a position measuring unit for measuring a position of the target material supplied from the target supply unit into the chamber, wherein
   the recovery control unit includes a counter for counting the number of output times of the target material, and
   the predetermined condition is that the number of the output times of the target material has reached a predetermined number of the output times.

4. A chamber apparatus used with a laser apparatus, comprising:
   a chamber provided with at least one inlet for introducing thereinto a laser beam outputted from the laser apparatus;
   a target supply unit provided to the chamber for supplying a target material to a predetermined region in the chamber;
   a recovery control unit for instructing the target supply unit to execute recovery operation if a predetermined condition is met;
   a recovery unit for executing the recovery operation in response to the instruction from the recovery control unit; and
   a position measuring unit for measuring a position of the target material supplied from the target supply unit into the chamber, wherein
   the recovery control unit determines a state of the target supply unit after the recovery unit executes the recovery operation on the target supply unit, shifts to a normal mode if it is determined that the target supply unit is in a normal state, and instructs the recovery unit to execute the recovery operation again if it is determined that the target supply unit is not in the normal state.

* * * * *